US011793026B2

(12) United States Patent
Sung et al.

(10) Patent No.: US 11,793,026 B2
(45) Date of Patent: Oct. 17, 2023

(54) DISPLAY DEVICE AND METHOD OF MANUFACTURING THE SAME

(71) Applicant: Samsung Display Co., Ltd., Yongin-si (KR)

(72) Inventors: Woo Yong Sung, Seoul (KR); Junghan Seo, Hwaseong-si (KR); Seungyong Song, Suwon-si (KR); Sanggab Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 188 days.

(21) Appl. No.: 17/450,178

(22) Filed: Oct. 7, 2021

(65) Prior Publication Data

US 2022/0165985 A1    May 26, 2022

(30) Foreign Application Priority Data

Nov. 25, 2020   (KR) .................. 10-2020-0160266

(51) Int. Cl.

| H01L 21/00 | (2006.01) |
|---|---|
| H10K 50/844 | (2023.01) |
| H10K 59/65 | (2023.01) |
| H10K 59/88 | (2023.01) |
| H10K 59/121 | (2023.01) |
| H10K 71/00 | (2023.01) |
| H10K 59/12 | (2023.01) |

(52) U.S. Cl.
CPC ......... *H10K 50/844* (2023.02); *H10K 59/121* (2023.02); *H10K 59/65* (2023.02); *H10K 59/88* (2023.02); *H10K 71/00* (2023.02); *H10K 59/1201* (2023.02)

(58) Field of Classification Search
CPC .................................................... H10K 50/844
See application file for complete search history.

(56) References Cited

U.S. PATENT DOCUMENTS

| 7,884,315 B2 | 2/2011 | Andre et al. |
|---|---|---|
| 8,947,627 B2 | 2/2015 | Rappoport et al. |
| 2020/0168671 A1 | 5/2020 | Jang et al. |
| 2020/0176520 A1 | 6/2020 | Kim et al. |
| 2021/0020866 A1 | 1/2021 | Choi et al. |

FOREIGN PATENT DOCUMENTS

| CN | 110212113 A | 9/2019 |
|---|---|---|
| KR | 10-2017-0059527 A | 5/2017 |
| KR | 10-2020-0036130 A | 4/2020 |

*Primary Examiner* — Douglas M Menz
(74) *Attorney, Agent, or Firm* — Lewis Roca Rothgerber Christie LLP

(57) ABSTRACT

A manufacturing method includes preparing a substrate, forming at least one groove in the substrate, forming an oxidation resistant film on an inner wall of the groove, and forming a first inorganic layer on the substrate and the oxidation resistant film is formed between the substrate and the first inorganic layer.

20 Claims, 20 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2020-0160266, filed in the Korean Intellectual Property Office on Nov. 25, 2020, the entire content of which is hereby incorporated by reference.

BACKGROUND

1. Field

Embodiments of the present disclosure relate to a display device and a method of manufacturing the same. For example, embodiments of the present disclosure relate to a display device with improved reliability.

2. Discussion of the Background

Among display devices, an organic light emitting display device including an organic light emitting diode has low power consumption, high luminance, and high reaction speed. However, the organic light emitting diode is vulnerable to moisture and/or oxygen and can be easily damaged. The penetration of moisture and/or oxygen may be delayed or reduced by using an inorganic layer included in the organic light emitting display device, but the inorganic layer may be oxidized by the moisture and/or the oxygen. When the inorganic layer is oxidized and moisture and/or oxygen penetrate into the organic light emitting diode, the reliability of the display device may be deteriorated.

The above information disclosed in this Background section is only for enhancement of understanding of the background and therefore the information discussed in this Background section does not necessarily constitute prior art.

SUMMARY

Some embodiments of the present disclosure provide a display device having improved reliability.

Some embodiments of the present disclosure provide a method of manufacturing the display device.

A method of manufacturing a display device according to embodiments of the present disclosure may include preparing a substrate having a hole area, a peripheral area surrounding the hole area, and a display area surrounding the peripheral area, forming at least one groove overlapping the peripheral area, forming an oxidation resistant film on an inner wall of the groove, and forming a first inorganic layer overlapping the display area on the substrate. The first inorganic layer may overlap the display area and the peripheral area, and the oxidation resistant film may be formed between the substrate and the first inorganic layer.

According to an embodiment, the inner wall of the groove may include a bottom surface of the groove and a side wall of the groove, and the oxidation resistant film may contact the bottom surface and the side wall.

According to an embodiment, the oxidation resistant film may be formed using an open mask including a shielding portion overlapping the display area and an opening portion overlapping the peripheral area.

According to an embodiment, the forming the oxidation resistant film may include forming a preliminary oxidation resistant film overlapping the peripheral area and the display area, forming a photoresist pattern on an inside of the groove, and removing a portion of the preliminary oxidation resistant film that does not overlap with the photoresist pattern.

According to an embodiment, the forming the photoresist pattern in the inside of the groove may include forming a preliminary photoresist pattern overlapping the peripheral area and the display area and entirely exposing the preliminary photoresist pattern.

According to an embodiment, the forming the photoresist pattern in the inside of the groove include forming a preliminary photoresist pattern overlapping the peripheral area and the display area and partially exposing the preliminary photoresist pattern.

According to an embodiment, the method may further include forming a first electrode overlapping the display area, forming an organic emission layer overlapping the display rea and the peripheral area on the first electrode, forming a dummy pattern between the oxidation resistant film and the first inorganic layer, and forming a second electrode between the organic emission layer and the first inorganic layer. The dummy pattern may be formed together with the organic emission layer.

According to an embodiment, the dummy pattern may contact the oxidation resistant film.

According to an embodiment, the oxidation resistant film may include at least one selected from the group consisting of silicon oxide, silicon nitride, and silicon oxynitride.

According to an embodiment, the oxidation resistant film may include at least one selected from the group consisting of metal and metal oxide.

A display device according to embodiments may include a substrate having a hole area, a peripheral area surrounding the hole area, and a display area surrounding the peripheral area and having a penetration hole overlapping the hole area and at least one groove overlapping the peripheral area, an emission structure on the substrate, overlapping the display area, and including a first inorganic layer, and an oxidation resistant film entirely on an inner wall of the groove. The first inorganic layer may overlap the display area and the peripheral area, and the oxidation resistant film may be between the substrate and the first inorganic layer.

According to an embodiment, the inner wall of the groove may include a bottom surface of the groove and a side wall of the groove, and the oxidation resistant film may contact the bottom surface and the side wall.

According to an embodiment, the emission structure may further include a first electrode, an organic emission layer on the first electrode, and a second electrode between the organic emission layer and the first inorganic layer. A dummy pattern including a same material as the organic emission layer may be between the oxidation resistant film and the first inorganic layer.

According to an embodiment, the dummy pattern may contact the oxidation resistant film.

According to an embodiment, the oxidation resistant film may include at least one selected from the group consisting of silicon oxide, silicon nitride, and silicon oxynitride.

According to an embodiment, the oxidation resistant film may include at least one selected from the group consisting of metal and metal oxide.

According to an embodiment, the display device may further include a functional module at least partially inside the penetration hole.

A display device according to embodiments may include a substrate having a hole area, a peripheral area surrounding the hole area, and a display area surrounding the peripheral area and having a penetration hole overlapping the hole area and at least one groove overlapping the peripheral area, an emission structure on the substrate, overlapping the display area, and including a first inorganic layer, and an oxidation resistant film on an inside of the groove and having an opening exposing the substrate. The first inorganic layer may overlap the display area and the peripheral area, and the oxidation resistant film may be between the substrate and the first inorganic layer.

According to an embodiment, the oxidation resistant film may surround a side wall of the inside of the groove.

According to an embodiment, the groove may include a first area overlapping the opening and second area surrounding the first area, and the oxidation resistant film may overlap the second area, and does not overlap the display area and the first area.

Therefore, the display device according to embodiments may include an oxidation resistant film surrounding side walls and/or inner walls of the grooves. The oxidation resistant film may be between the substrate and the inorganic layer which is included in the thin film encapsulation layer. The oxidation resistant film may prevent or reduce penetration of moisture and/or oxygen into the inorganic layer. Accordingly, the oxidation resistant film may delay or reduce oxidation of the inorganic layer. Because the oxidation resistant film may delay or reduce oxidation of the inorganic layer, reliability of the display device may be improved.

It is to be understood that both the foregoing general description and the following detailed description describe aspects of some example embodiments and are intended to provide further explanation of the subject matter of the present disclosure.

BRIEF DESCRIPTION OF THE DRAWINGS

The accompanying drawings, which are included to provide a further understanding of the subject matter of the present disclosure and are incorporated in and constitute a part of this specification, illustrate example embodiments of the present disclosure, and together with the description serve to explain aspects of embodiments according to the present disclosure.

DETAILED DESCRIPTION

Illustrative, non-limiting example embodiments of the present disclosure will be more clearly understood from the following detailed description in conjunction with the accompanying drawings.

Figure 1:
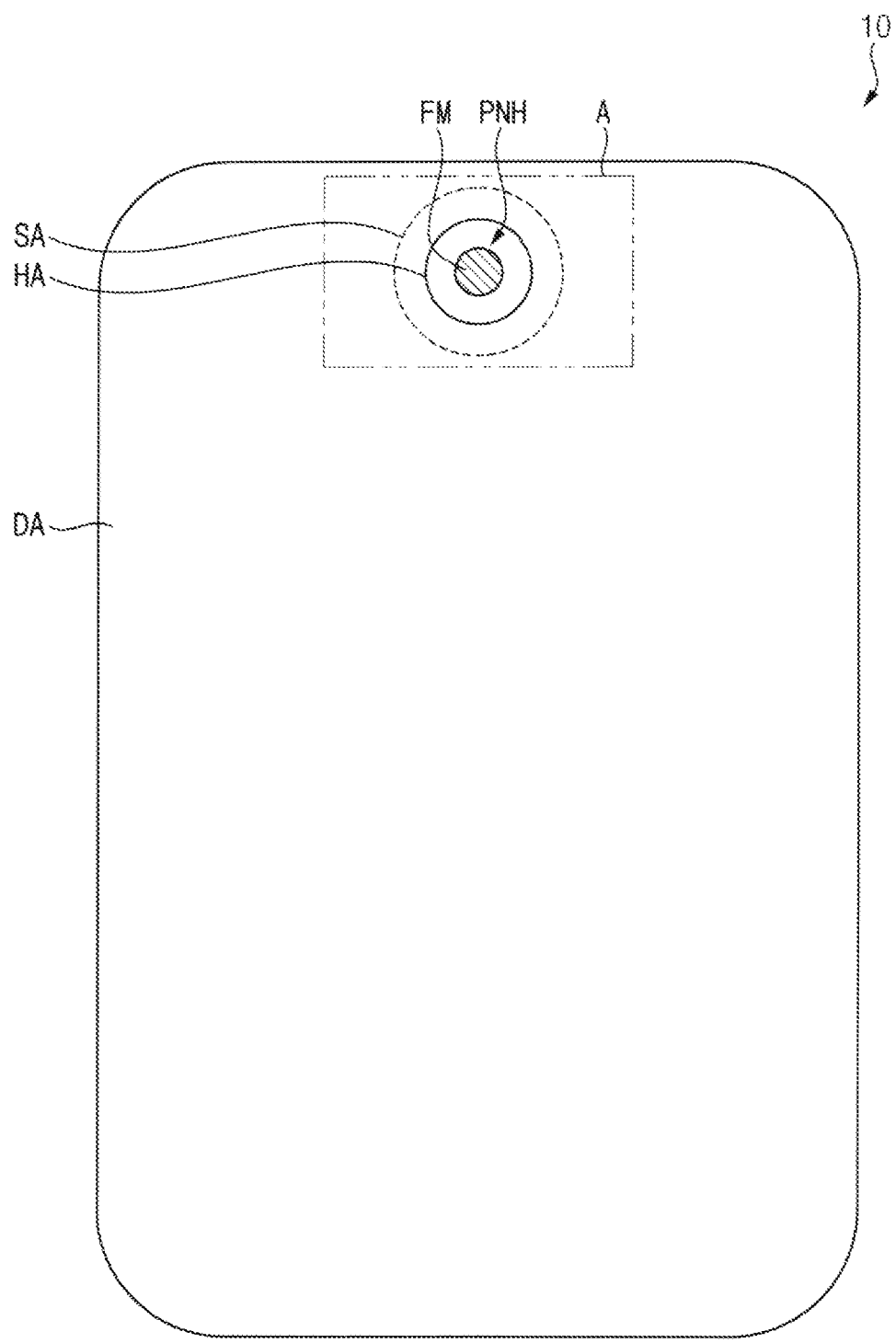
FIG. 1 is a plan view illustrating a display device according to embodiments of present disclosure.
Figure 2:
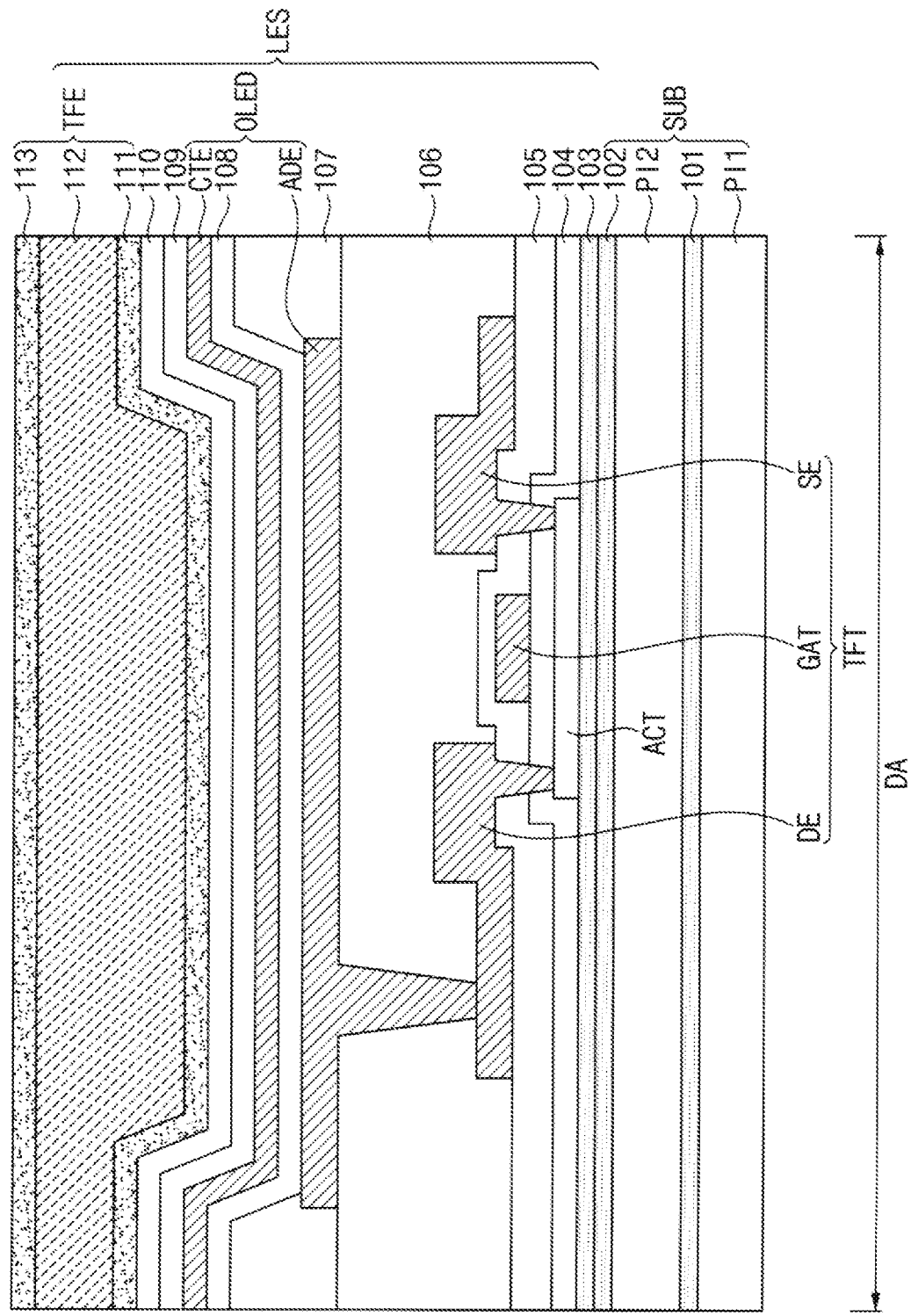
FIG. 2 is a cross-sectional view corresponding to a display area of the display device of FIG. 1.

FIG. 1 is a plan view illustrating a display device according to embodiments of present disclosure. FIG. 2 is a cross-sectional view corresponding to a display area of the display device of FIG. 1.

Referring to FIG. 1, a display device 10 according to embodiments of present disclosure may have a hole area HA, a peripheral area SA, and a display area DA.

In one or more embodiments, the display area DA may be positioned to surround at least a portion of the peripheral area SA. A plurality of pixels may be in the display area DA. Each of the pixels may include at least one transistor TFT and at least one organic light emitting diode OLED. The transistor TFT may supply a driving current to the organic light emitting device OLED, and the organic light emitting device OLED may emit light based on the driving current. As the pixels emit light, an image may be displayed in the display area DA.

In one or more embodiments, the peripheral area SA and the hole area HA may be defined as a non-display area of the display device 10. For example, the peripheral area SA may be positioned to surround at least a portion of the hole area HA.

In one or more embodiments, a penetration hole PNH may be formed in the hole area HA. The display device 10 may include a functional module FM overlapping the through area HA. At least a portion of the functional module FM may be inside the penetration hole PNH. For example, the functional module FM may be a camera module for capturing (or recognizing) an image of an object located in front of the display device 10, a face recognition sensor module for detecting a user's face, a pupil recognition sensor module for detecting a user's pupils, an acceleration sensor module and/or a geomagnetic sensor module for determining movement of the display device 10, a proximity sensor module and/or an infrared sensor module for detecting whether the front of the display device 10 is close (e.g., close to another object), an illuminance sensor module for measuring the degree of external brightness, etc.

In one or more embodiments, a plurality of grooves may be formed in the peripheral area SA. For example, the peripheral area SA may be an area between a boundary line of the penetration hole PNH and a boundary line of the display area DA. The grooves may delay or reduce penetration of moisture and/or oxygen flowing into pixels through the penetration hole PNH.

In FIG. 1, the display device 10 has a rectangular shape and the hole area HA has a circular shape, but the shapes of the display area DA and the hole area HA are not limited thereto. In addition, one or more hole areas HA may be defined (e.g., a plurality of hole areas HA may be provided), and locations of the hole areas HA are not limited to an upper end of the display device 10.

Referring to FIG. 2, the display device 10 may include a substrate SUB and an emission structure LES. The emission structure LES may be on the substrate SUB and may overlap the display area DA. The emission structure LES may include a first buffer layer 103, an active pattern ACT, a first gate insulating layer 104, a gate electrode GAT, a first interlayer insulating layer 105, a source electrode SE, a drain electrode DE, a first via insulating layer 106, a first electrode ADE, a first pixel defining layer 107, a first organic emission layer 108, a second electrode CTE, a first capping layer 109, a first protective layer 110, a first inorganic layer 111, an encapsulation organic layer 112, and a second inorganic layer 113.

The active pattern ACT, the gate electrode GAT, the source electrode SE, and the drain electrode DE may constitute the transistor TFT. The first electrode ADE, the first organic emission layer 108, and the second electrode CTE may constitute the organic light emitting diode OLED. The first inorganic layer 111, the encapsulation organic layer 112, and the second inorganic layer 113 may constitute a thin film encapsulation layer TFE.

The substrate SUB may include a lower organic layer PI1, a lower barrier layer 101, an upper organic layer PI2, and a first upper barrier layer 102. The lower barrier layer 101 may be on the lower organic layer PI1, the upper organic layer PI2 may be on the lower barrier layer 101, and the first upper barrier layer 102 may be on the upper organic layer PI2.

The lower organic layer PI1 may include glass, quartz, plastic, and/or the like. In one or more embodiments, the lower organic layer PI1 may include polyimide. The upper organic layer PI2 may include the same material as the lower organic layer PI1.

The lower barrier layer 101 may include an organic material and/or an inorganic material. In one or more embodiments, the lower barrier layer 101 may include silicon oxide ("SiOx"), silicon nitride ("SiNx"), silicon oxynitride ("SiON"), and/or the like. The first upper barrier layer 102 may include the same material as the lower barrier layer 101.

The first buffer layer 103 may be on the first upper barrier layer 102. For example, the first buffer layer 103 may include silicon oxide ("SiOx"), silicon nitride ("SiNx"), silicon oxynitride ("SiON"), and/or the like. The first buffer layer 103 may prevent or reduce diffusion of metal atoms and/or impurities into the active pattern ACT. In addition, the first buffer layer 103 may control the rate of heat provided to the active pattern ACT (e.g., may control the rate of heat propagation to the active pattern ACT) during a crystallization process for forming the active pattern ACT.

The active pattern ACT may be on the first buffer layer 103. In one or more embodiments, the active pattern ACT may include a silicon semiconductor. For example, the active pattern ACT may include amorphous silicon, polycrystalline silicon, and/or the like.

The first gate insulating layer 104 may be on the first buffer layer 103 and may cover the active pattern ACT. In one or more embodiments, the first gate insulating layer 104 may include an insulating material. For example, the first gate insulating layer 104 may include silicon oxide ("SiOx"), silicon nitride ("SiNx"), silicon oxynitride ("SiON"), and/or the like.

The gate electrode GAT may be on the first gate insulating layer 104. The gate electrode GAT may overlap the active pattern ACT. In response to a gate signal provided to the gate electrode GAT, a signal and/or a voltage may be transmitted through the active pattern ACT. In one or more embodiments, the gate electrode GAT may include a metal, an alloy, a metal oxide, a transparent conductive material, and/or the like. For example, the gate electrode GAT may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

The first interlayer insulating layer 105 may be on the first gate insulating layer 104 and may cover the gate electrode GAT. In one or more embodiments, the first interlayer insulating layer 105 may include an insulating material. For example, the first interlayer insulating layer 105 may include silicon oxide ("SiOx"), silicon nitride ("SiNx"), silicon oxynitride ("SiON"), and/or the like.

The source electrode SE and the drain electrode DE may be on the first interlayer insulating layer 105. The source electrode SE and the drain electrode DE may contact (e.g., physically contact) the active pattern ACT. In one or more embodiments, the source electrode SE and the drain electrode DE may each independently include a metal, an alloy, a metal oxide, a transparent conductive material, and/or the like. For example, the source electrode SE and the drain electrode DE may each independently include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

The first via insulating layer 106 may be on the first interlayer insulating layer 105 and may cover the source electrode SE and the drain electrode DE. In one or more embodiments, the first via insulating layer 106 may include an organic insulating material. Accordingly, the first via insulating layer 106 may have a substantially flat top surface. For example, the first via insulating layer 106 may include a photoresist, a polyacrylic resin, a polyimide resin, an acrylic resin, and/or the like.

The first electrode ADE may be on the first via insulating layer 106. The first electrode ADE may contact (e.g., physically contact) the drain electrode DE. In one or more embodiments, the first electrode ADE may include a metal, an alloy, a metal oxide, a transparent conductive material, and/or the like. For example, the first electrode ADE may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

The first pixel defining layer 107 may be on the first via insulating layer 106. An opening exposing the first electrode ADE may be formed in the first pixel defining layer 107. In one or more embodiments, the first pixel defining layer 107 may include an organic material. For example, the first pixel defining layer 107 may include a photoresist, a polyacrylic resin, a polyimide resin, an acrylic resin, and/or the like.

The first organic emission layer 108 may be on the first electrode ADE. The first organic emission layer 108 may include an organic material emitting light of a preset color.

The first organic emission layer 108 may emit the light based on a voltage difference between the first electrode ADE and the second electrode CTE.

In addition, the first organic emission layer may include at least one selected from a hole injection layer ("HIL"), a hole transport layer ("HTL"), an electron transport layer ("ETL"), and an electron injection layer ("EIL").

The second electrode CTE may be on the first organic emission layer 108. The second electrode CTE may include a metal, an alloy, a metal oxide, a transparent conductive material, and/or the like. For example, the second electrode CTE may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

The first capping layer 109 may be on the second electrode CTE. The first capping layer 109 may include an organic material and may be located along a profile of the second electrode CTE. Accordingly, the first capping layer 109 may improve light extraction efficiency of the light emitted from the first organic emission layer 108.

The first protective layer 110 may be on the first capping layer 109. The first protective layer 110 may protect the first capping layer 109 that may otherwise be damaged in the process of forming the first inorganic layer 111. For example, the first inorganic layer 111 may be formed using a chemical vapor deposition ("CVD") process. When the first capping layer 109 is exposed, the first capping layer 109 may be damaged during the chemical vapor deposition process, and the light extraction efficiency may be reduced. Accordingly, in order to prevent or reduce damage to the first capping layer 109, the first protective layer 110 may be on the first capping layer 109 during the chemical vapor deposition process. In one or more embodiments, the first protective layer 110 may include an inorganic material. For example, the first protective layer 110 may include lithium fluoride ("LiF").

The first inorganic layer 111 may be on the first protective layer 110. In one or more embodiments, the first inorganic layer 111 may include an inorganic material, and may be located along a profile of the first protective layer 110. For example, the first inorganic layer 111 may include silicon oxide ("SiOx"), silicon nitride ("SiNx"), silicon oxynitride ("SiON"), and/or the like.

The first inorganic layer 111 may prevent or reduce penetration of oxygen and/or moisture, and accordingly, the organic light emitting diode OLED may not be deteriorated (or a likelihood or degree of such deterioration may be reduced). In addition, the first inorganic layer 111 may protect the organic light emitting diode OLED from impact.

The encapsulation organic layer 112 may be on the first inorganic layer 111. In one or more embodiments, the encapsulation organic layer 112 may include an organic material and may have a substantially flat top surface. For example, the encapsulation organic layer 112 may include a photoresist, a polyacrylic resin, a polyimide resin, an acrylic resin, and/or the like. The encapsulation organic layer 112 may prevent or reduce propagation of cracks generated in the thin film encapsulation layer TFE.

The second inorganic layer 113 may be on the encapsulation organic layer 112. In one or more embodiments, the second inorganic layer 113 may include an inorganic material and may be located along a profile of the encapsulation organic layer 112. For example, the second inorganic layer 113 may include silicon oxide ("SiOx"), silicon nitride ("SiNx"), silicon oxynitride ("SiON"), and/or the like.

However, a stacked structure of the display device 10 is not limited to the stacked structure shown in FIG. 2. For example, the display device 10 may not include the lower organic layer PI1 and the lower barrier layer 101, and may further include connection patterns between the first via insulating layer 106 and the first electrode ADE.

Figure 3:
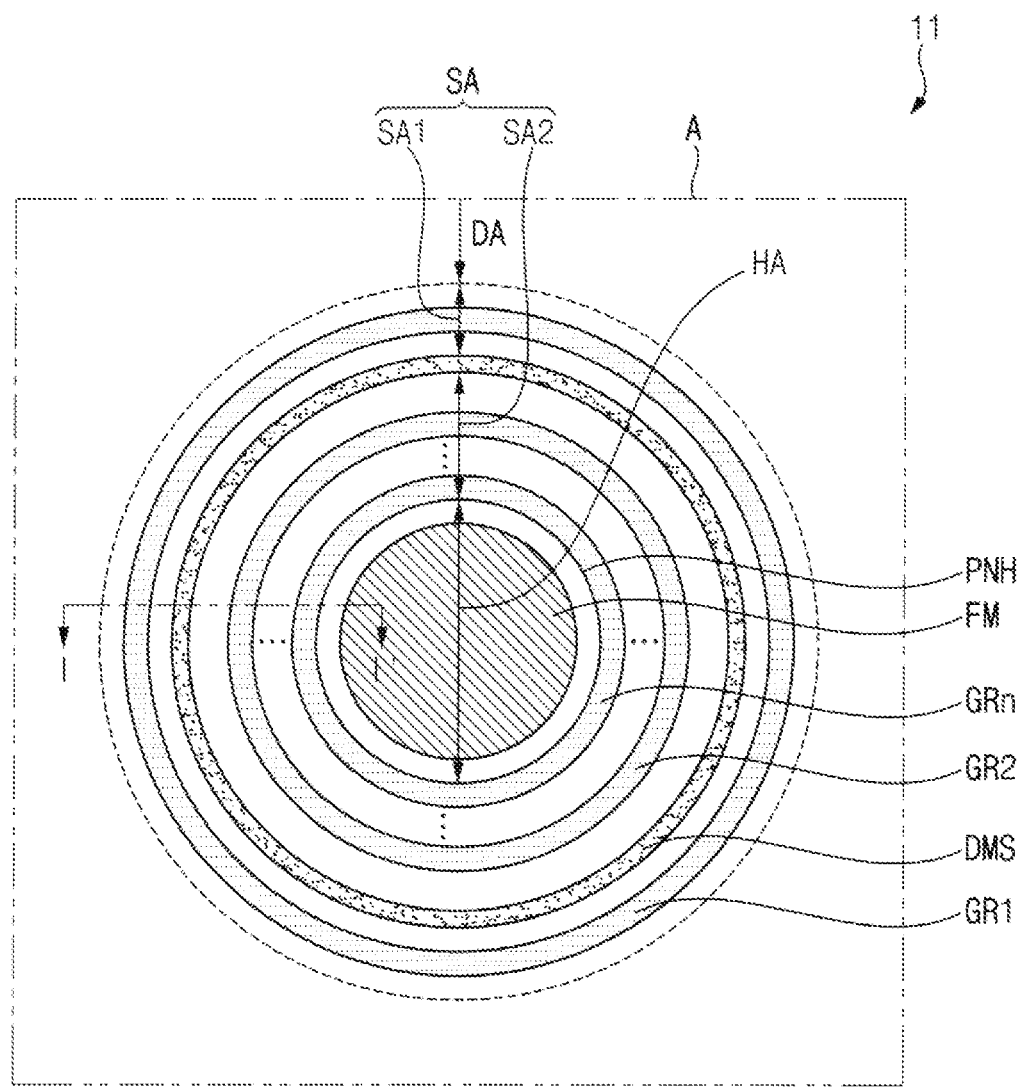
FIG. 3 is an enlarged view of area A of FIG. 1, illustrating a display device according to an embodiment.
Figure 4:
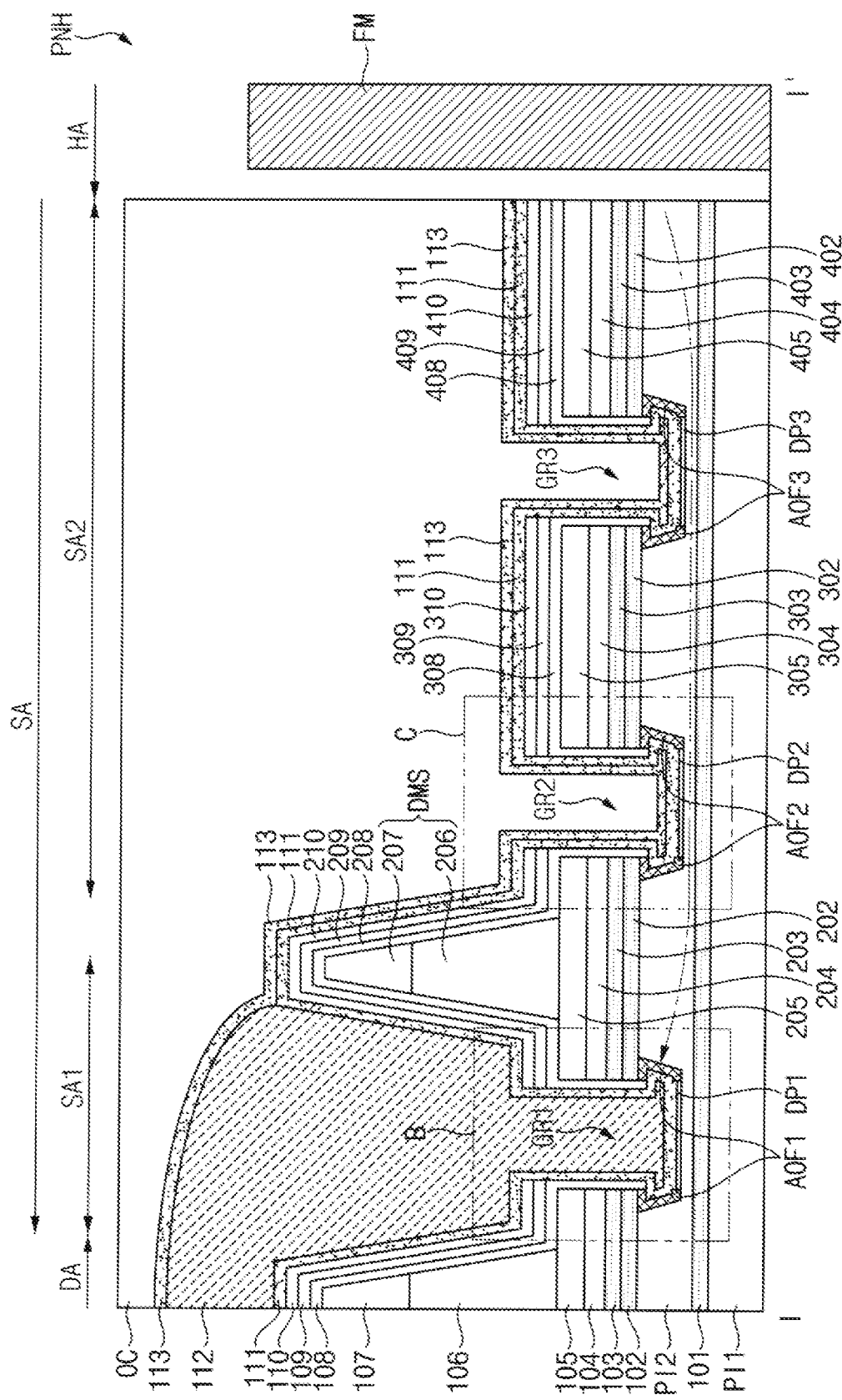
FIG. 4 is a cross-sectional view taken along line I-I' of FIG. 3.
Figure 5:
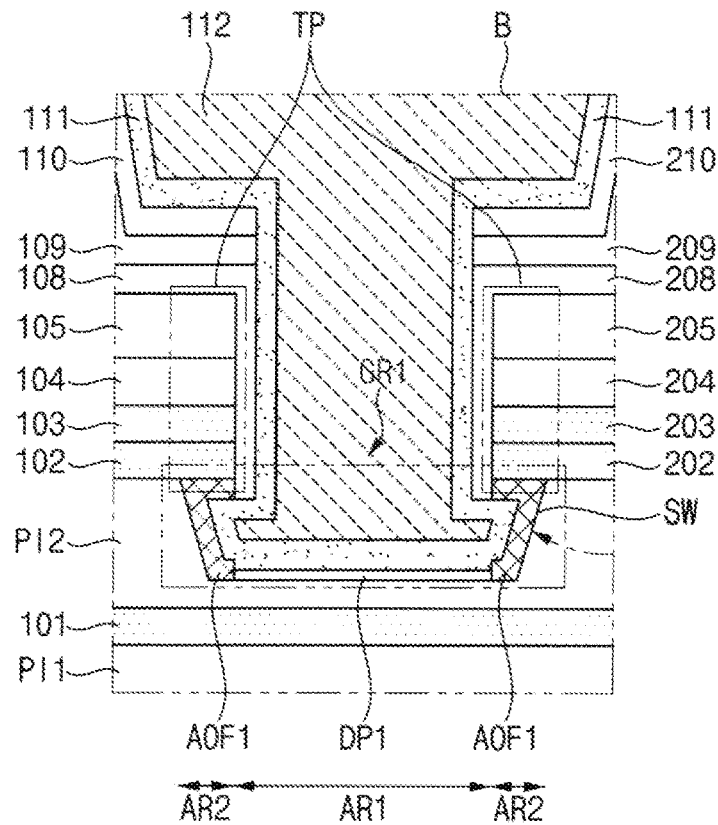
FIG. 5 is an enlarged cross-sectional view of area B of FIG. 4.

FIG. 3 is an enlarged view illustrating a display device according to an embodiment. FIG. 4 is a cross-sectional view taken along line I-I' of FIG. 3. FIG. 5 is an enlarged cross-sectional view of area B of FIG. 4. For example, FIG. 3 is an enlarged view of area A of FIG. 1.

Referring to FIG. 3, a display device 11 according to an embodiment of present disclosure may have the display area DA, the peripheral area SA, and the hole area HA. The display device 11 may include the functional module FM overlapping the hole area HA and a dam structure DMS overlapping the peripheral area SA.

In one or more embodiments, the peripheral area SA may be divided into a first peripheral area SA1 and a second peripheral area SA2 based on the dam structure DMS. For example, the first peripheral area SA1 may be an area between the dam structure DMS and the display area DA, and the second peripheral area SA2 may be an area between the dam structure DMS and the hole area HA.

The grooves may be formed in the peripheral area SA of the display device 11. In one or more embodiments, a first groove GR1 may be formed in the first peripheral area SA1, and second to n-th grooves (where n is an integer greater than or equal to 2) GR2, . . . , and GRn may be formed in the second peripheral area SA2. Each of the first to n-th grooves GR1, GR2, . . . , and GRn may have a shape surrounding the hole area HA on a plane.

Referring to FIGS. 3 and 4, the display device 11 may include the first to third grooves GR1, GR2, and GR3, but the present disclosure is not limited thereto.

The lower organic layer PI1, the lower barrier layer 101, and the upper organic layer PI2 may overlap the display area DA and the peripheral area SA. In other words, the lower organic layer PI1, the lower barrier layer 101, and the upper organic layer PI2 may extend from the display area DA to the peripheral area SA.

The first upper barrier layer 102, the first buffer layer 103, the first gate insulating layer 104, and the first interlayer insulating layer 105 may overlap the display area DA and the first peripheral area SA1. For example, the first upper barrier layer 102, the first buffer layer 103, the first gate insulating layer 104, and the first interlayer insulating layer 105 may extend from the display area DA to the first peripheral area SA1.

A second upper barrier layer 202, a second buffer layer 203, a second gate insulating layer 204, and a second interlayer insulating layer 205 may be on the upper organic layer PI2, and may overlap the dam structure DMS.

A third upper barrier layer 302, a third buffer layer 303, a third gate insulating layer 304, and a third interlayer insulating layer 305 may be on the upper organic layer PI2, may overlap the second peripheral area SA2, and may be located between the second groove GR2 and the third groove GR3.

A fourth upper barrier layer 402, a fourth buffer layer 403, a fourth gate insulating layer 404, and a fourth interlayer insulating layer 405 may be on the upper organic layer PI2, and may overlap the second peripheral area SA2, and may be located between the third groove GR3 and the hole area HA.

In one or more embodiments, the first to fourth upper barrier layers 102, 202, 302, and 402 may be in the same layer (e.g., may be in a same plane and/or formed from a same layer). For example, the first to fourth upper barrier layers 102, 202, 302, and 402 may include the same material and may be formed together. In addition, the first to fourth buffer layers 103, 203, 303, and 403 may be in the same layer (e.g., may be in a same plane and/or formed from a same layer), the first to fourth gate insulating layers 104, 204, 304, and 404 may be in the same layer (e.g., may be in a same plane and/or formed from a same layer), and the first to fourth interlayer insulating layers 105, 205, 305, and 405 may be in the same layer (e.g., may be in a same plane and/or formed from a same layer).

The dam structure DMS may be on the second interlayer insulating layer 205 and may overlap the peripheral area SA. For example, the dam structure DMS may be located between the first peripheral area SA1 and the second peripheral area SA2. The dam structure DMS may define a boundary of the encapsulation organic layer 112.

In one or more embodiments, the dam structure DMS may include a second via insulating layer 206 and a second pixel defining layer 207. The second via insulating layer 206 may be in the same layer as the first via insulating layer 106, and the second pixel defining layer 207 may be in the same layer as the first pixel defining layer 107.

The first organic emission layer 108, the first capping layer 109, and the first passivation layer 110 may overlap the display area DA and the first peripheral area SA1. For example, the first organic emission layer 108, the first capping layer 109, and the first protective layer 110 may extend from the display area DA to the first peripheral area SA1.

A second organic emission layer 208, a second capping layer 209, and a second protective layer 210 may be on the dam structure DMS along a profile of the dam structure DMS (e.g., to cover a top and inclined sides of the dam structure DMS).

A third organic emission layer 308, a third capping layer 309, and a third protective layer 310 may be on the third interlayer insulating layer 305, may overlap the second peripheral area SA2, and may be located between the second groove GR2 and the third groove GR3.

A fourth organic emission layer 408, a fourth capping layer 409, and a fourth protective layer 410 may be on the fourth interlayer insulating layer 405, may overlap the second peripheral area SA2, and may be located between the third groove GR3 and the hole area HA.

In one or more embodiments, the first to fourth organic emission layers 108, 208, 308, and 408 may be in the same layer (e.g., may be in a same plane and/or formed from a same layer). For example, the first to fourth organic emission layers 108, 208, 308, and 408 may include the same material and may be formed together. In addition, the first to fourth capping layers 109, 209, 309, and 409 may be in the same layer (e.g., may be in a same plane and/or formed from a same layer), and the first to fourth protective layers 110, 210, 310, and 410 may be in the same layer (e.g., may be in a same plane and/or formed from a same layer).

The first inorganic layer 111 may overlap the display area DA and the peripheral area SA. For example, the first inorganic layer 111 may extend from the display area DA to the peripheral area SA. In one or more embodiments, the first inorganic layer 111 may be entirely located along profiles of the first protective layer 110, the first groove GR1, the second protective layer 210, the second groove GR2, the third protective layer 310, the third groove GR3, and the fourth protective layer 410.

The encapsulation organic layer 112 may overlap the display area DA and the first peripheral area SA1. For example, the encapsulation organic layer 112 may extend from the display area DA to the first peripheral area SA1. The dam structure DMS may control or reduce an overflow of the encapsulation organic layer 112 and may prevent or reduce extension of the encapsulation organic layer 112 to the second peripheral area SA2.

The third inorganic layer 113 may overlap the display area DA and the peripheral area SA. For example, the third inorganic layer 113 may extend from the display area DA to the peripheral area SA. In one or more embodiments, the first inorganic layer 111 may be entirely located along the profiles of the encapsulation organic layer 112 and the first inorganic layer 111.

An overcoat layer OC may overlap the display area DA and the peripheral area SA. For example, the overcoat layer OC may extend from the display area DA to the peripheral area SA. In one or more embodiments, the overcoat layer OC may include an organic material and may have a substantially flat top surface.

Referring to FIGS. 4 and 5, the upper organic layer PI2 may include the first groove GR1 between the display area DA and the dam structure DMS. A first oxidation resistant film AOF1, a first dummy pattern DP1, the first inorganic layer 111, and the encapsulation organic layer 112 may be on an inside of the first groove GR1.

In one or more embodiments, the first groove GR1 may have an undercut shape in a cross-sectional view. For example, an area of a top surface of the first groove GR1 may be larger than an area of a bottom surface of the first groove GR1. In addition, the first upper barrier layer 102, the first buffer layer 103, the first gate insulating layer 104, and the first interlayer insulating layer 105 may partially overlap the top surface, and the second upper barrier layer 202, the second buffer layer 203, the second gate insulating layer 204, and the second interlayer insulating layer 205 may partially overlap the top surface. Accordingly, the first upper barrier layer 102, the first buffer layer 103, the first gate insulating layer 104, the first interlayer insulating layer 105, the first upper barrier layer 202, the second buffer layer 203, the second gate insulating layer 204, and the second interlayer insulating layer 205 which are partially overlapping the top surface may be defined as a tip TP.

In one or more embodiments, the first groove GR1 may include a first area AR1 positioned at a center of the first groove GR1 and a second area AR2 surrounding the first area AR1.

In one or more embodiments, the first oxidation resistant film AOF1 may be formed in the second area AR2 of the first groove GR1. For example, the first oxidation resistant film AOF1 may surround a side wall SW of the inside of the first groove GR1.

In one or more embodiments, the first oxidation resistant film AOF1 may overlap the tip TP. For example, an end of the first oxidation resistant film AOF1 may coincide with an end of the tip TP. As will be further described herein below with reference to FIG. 9, the tip TP may function as a mask for forming the first oxidation resistant film AOF1.

In one or more embodiments, the first oxidation resistant film AOF1 may not overlap the display area DA and the first area AR1.

In one or more embodiments, the first oxidation resistant film AOF1 may include inorganic materials such as silicon oxide ("SiOx"), silicon nitride ("SiNx"), and/or silicon oxynitride ("SiON"). In another embodiment, the first oxidation resistant film AOF1 may include at least one selected from a metal and a metal oxide. For example, the first oxidation resistant film AOF1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

In one or more embodiments, an opening overlapping the first area AR1 may be formed in the first oxidation resistant film AOF1. The opening may expose the upper organic layer PI2.

In one or more embodiments, the first dummy pattern DP1 may be in the opening on the upper organic layer PI2. The first dummy pattern DP1 may contact (e.g., physically contact) the upper organic layer PI2. For example, the first dummy pattern DP1 may include the same material as the first organic emission layer 108. For example, the first and second organic emission layers 108 and 208 may be disconnected by the tip TP. As the first and second organic emission layers 108 and 208 are disconnected, a piece of the organic emission layer formed in the first groove GR1 may be defined as the first dummy pattern DP1. As the first dummy pattern DP1 is disconnected from (e.g., separated from) the first and second organic emission layers 108 and 208 and is on the upper organic layer PI2, the first dummy pattern DP1 may delay or reduce the penetration of moisture and/or oxygen.

In one or more embodiments, the first inorganic layer 111 may be on the first oxidation resistant film AOF1 inside the first groove GR1. For example, the first oxidation resistant film AOF1 may be between the upper organic layer PI2 and the first inorganic layer 111. The encapsulation organic layer 112 may fill the inside of the first groove GR1.

Figure 6:
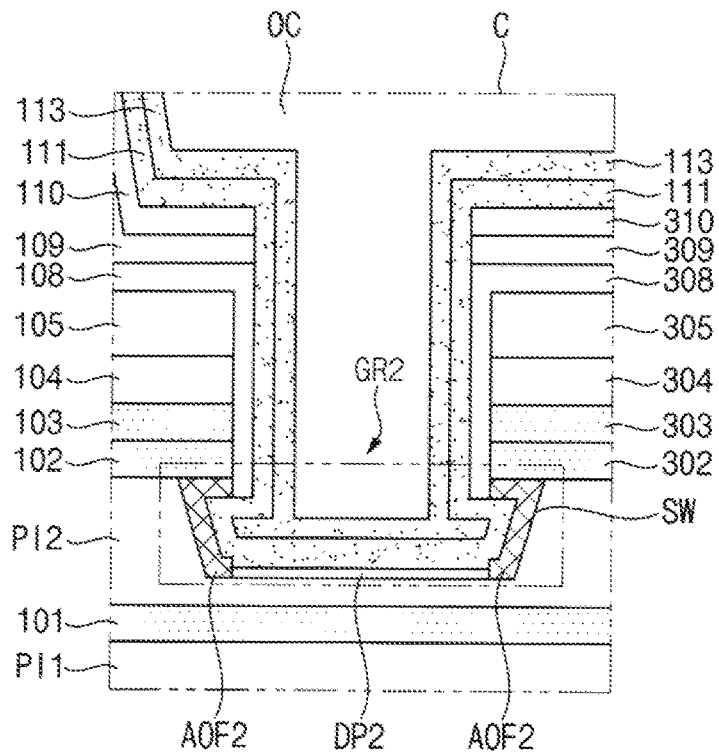
FIG. 6 is an enlarged cross-sectional view of area C of FIG. 4.

Referring to FIGS. 4 and 6, the upper organic layer PI2 may include the second groove GR2 between the dam structure DMS and the hole area HA. A second oxidation resistant film AOF2, a second dummy pattern DP2, the first inorganic layer 111, the second inorganic layer 113, and the overcoat layer OC may be on an inside the second groove GR2. However, because the structure of the second groove GR2 is substantially the same as the structure of the first groove GR1, hereinafter, differences will be further described below.

The second inorganic layer 113 may be on the first inorganic layer 111 on the inside the second groove GR2. The overcoat layer OC may fill the inside of the second groove GR2.

The display device 11 may include the first oxidation resistant film AOF1 surrounding the side wall SW of the first groove GR1. The first oxidation resistant film AOF1 may be between the upper organic layer PI2 and the first inorganic layer 111. Accordingly, the first oxidation resistant film AOF1 may protect the first inorganic layer 111 from moisture and/or oxygen penetrating through the upper organic layer PI2 adjacent to the hole area HA. Because the first oxidation resistant film AOF1 may delay or reduce oxidation of the first inorganic layer 111, reliability of the display device 11 may be improved.

FIGS. 7 to 12 are cross-sectional views illustrating a method of manufacturing the display device of FIG. 3. For example, FIGS. 7 to 12 may be enlarged cross-sectional views of area B of FIG. 4.

Figure 7:
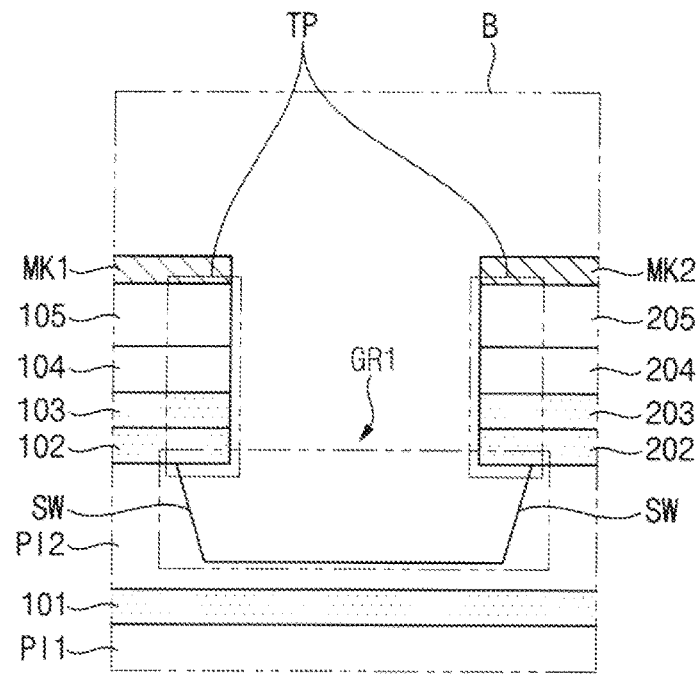
FIGS. 7 to 12 are cross-sectional views illustrating a method of manufacturing the display device of FIG. 3.

Referring to FIG. 7, a first mask pattern MK1 may be on the first interlayer insulating layer 105, and a second mask pattern MK2 may be on the second interlayer insulating layer 205. In one or more embodiments, the first and second mask patterns MK1 and MK2 may include metal oxide. For example, the first and second mask patterns MK1 and MK2 may include indium zinc oxide ("IZO"). Thereafter, a portion of the upper organic layer PI2 may be removed through a first etching process. Accordingly, the first groove GR1 having the undercut shape may be formed.

Figure 8:
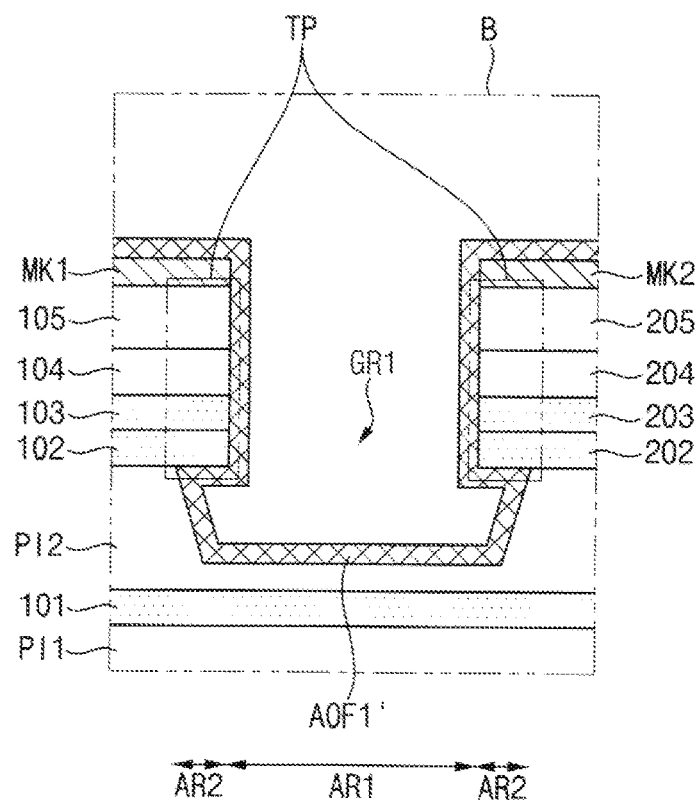

Referring to FIG. 8, a first preliminary oxidation resistant film AOF1' may be formed. In one or more embodiments, the first preliminary oxidation resistant film AOF1' may be formed using a chemical vapor deposition ("CVD") process. Accordingly, the first preliminary oxidation resistant film AOF1' may be located along profiles of an upper surface of the first mask pattern MK1, an end of the tip TP, a side wall of the first groove GR1, a bottom surface of the first groove GR1, and an upper surface of the second mask pattern MK2. In addition, the first preliminary oxidation resistant film AOF1' may be formed before the first organic emission layer 108, the second organic emission layer 208, and the first dummy pattern DP1 are formed. Accordingly, the chemical vapor deposition process for forming the first preliminary oxidation resistant film AOF1' may be performed at a high temperature (e.g., about 200 degree Celsius). Accordingly, a void of the first preliminary oxidation resistant film AOF1' may be reduced and a density may be increased. Therefore, the first oxidation resistant film AOF1 may further prevent or reduce the penetration of moisture and/or oxygen.

Figure 9:
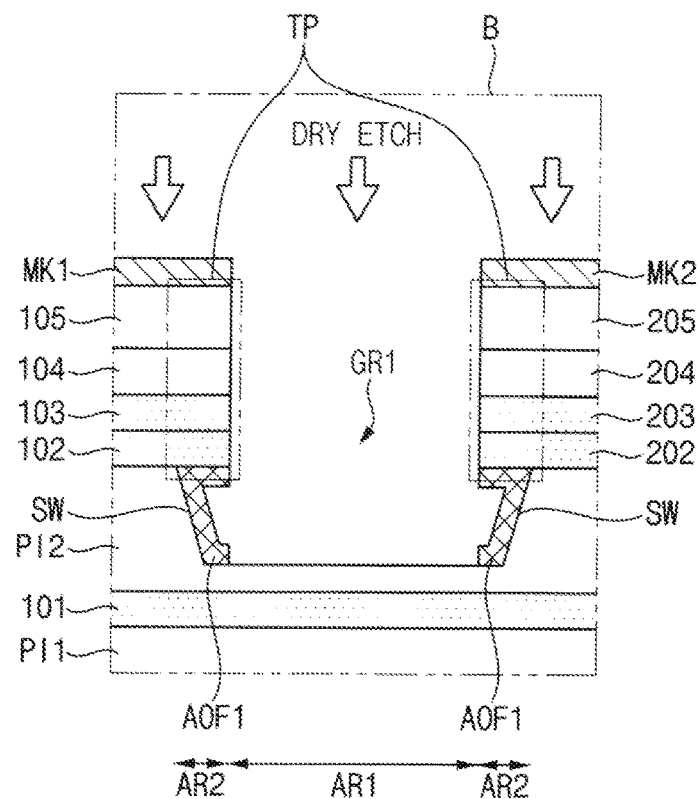

Referring to FIG. 9, the first oxidation resistant film AOF1 may be formed. In one or more embodiments, the first preliminary oxidation resistant film AOF1' may be removed through a second etching process. The second etching process may be a dry etching process using the tip TP as a mask. The first preliminary oxidation resistant film AOF1' overlapping the tip TP may remain due to anisotropic etching in the second etching process. On the other hand, the first preliminary oxidation resistant film AOF1' which does not overlap the tip TP may be removed. Accordingly, an opening overlapping the first area AR1 may be formed in the first oxidation resistant film AOF1. The opening may expose the upper organic layer PI2. In addition, the first oxidation resistant film AOF1 may overlap the tip TP.

Figure 10:
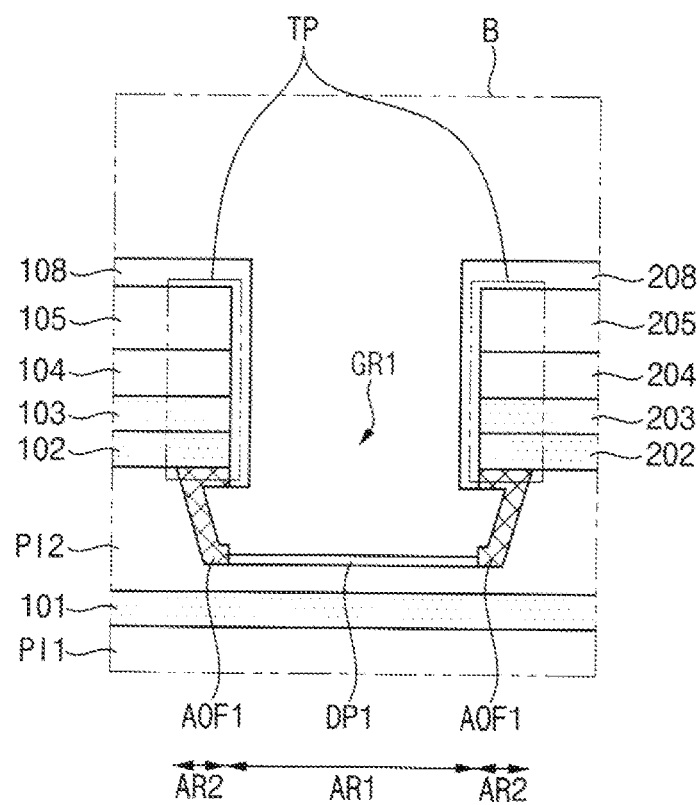

Referring to FIG. 10, the first and second mask patterns MK1 and MK2 may be removed. Thereafter, the first organic emission layer 108, the first dummy pattern DP1, and the second organic emission layer 208 may be formed. In one or more embodiments, the first organic emission layer 108, the first dummy pattern DP1, and the second organic emission layer 208 may be formed together. Accordingly, the first dummy pattern DP1 may include the same material as the first and second organic emission layers 108 and 208.

In addition, the first organic emission layer 108, the first dummy pattern DP1, and the second organic emission layer 208 may be disconnected by (e.g., separated by) the tip TP. For example, by anisotropic deposition in a vacuum deposition process, the first organic emission layer 108, the first dummy pattern DP1, and the second organic emission layer 208 may be not formed under the tip TP. Accordingly, the first dummy pattern DP1 may be formed in the opening of the first oxidation resistant film AOF1. For example, the first dummy pattern DP1 may overlap the first area AR1. In one or more embodiments, the first oxidation resistant film AOF1 may not be between the upper organic layer PI2 and the first dummy pattern DP1. For example, the first dummy pattern DP1 may contact (e.g., physically contact) the upper organic layer PI2.

Figure 11:
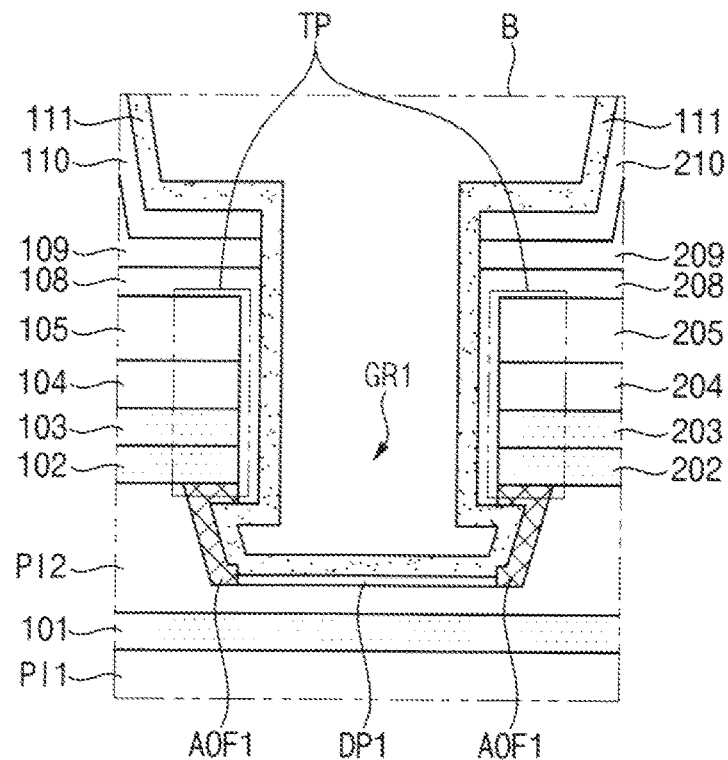

Referring to FIG. 11, the first capping layer 109 and the second capping layer 209 may be formed, and the first protective layer 110 and the second protective layer 210 may be formed. In addition, the first inorganic layer 111 may be formed. In one or more embodiments, the first inorganic layer 111 may be formed using a chemical vapor deposition ("CVD") process. Accordingly, the first inorganic layer 111 may be formed along profiles of the first protective layer 110, the first oxidation resistant film AOF1, the first dummy pattern DP1, and the second protective layer 210.

Figure 12:
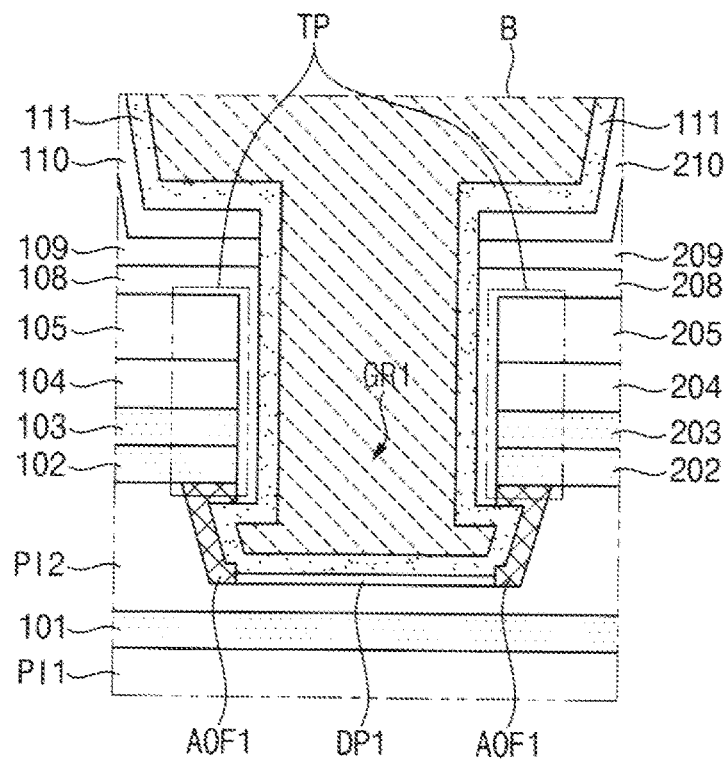

Referring to FIG. 12, the encapsulation organic layer 112 may be formed. In one or more embodiments, the encapsulation organic layer 112 may fill the inside of the first groove GR1.

Figure 13:
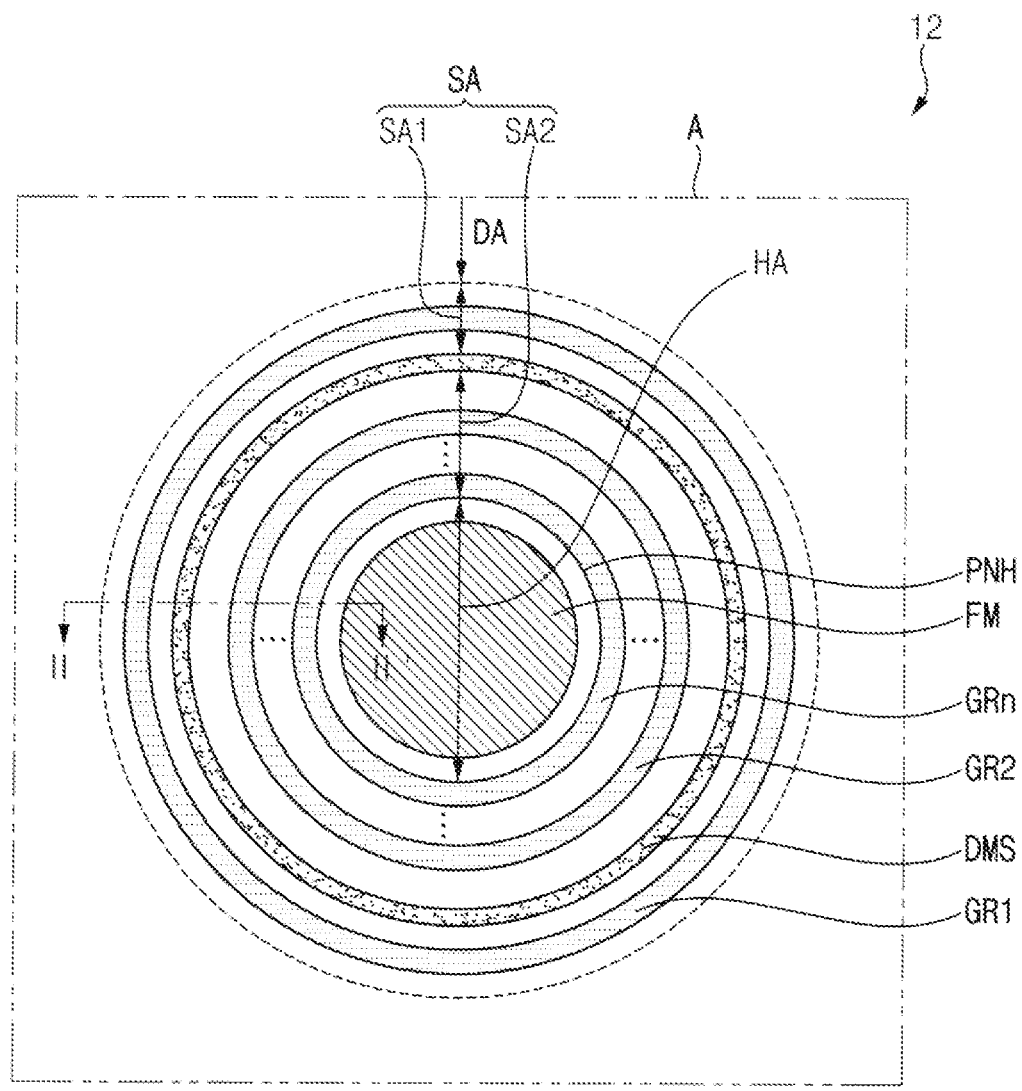
FIG. 13 is an enlarged view illustrating a display device according to another embodiment.
Figure 14:
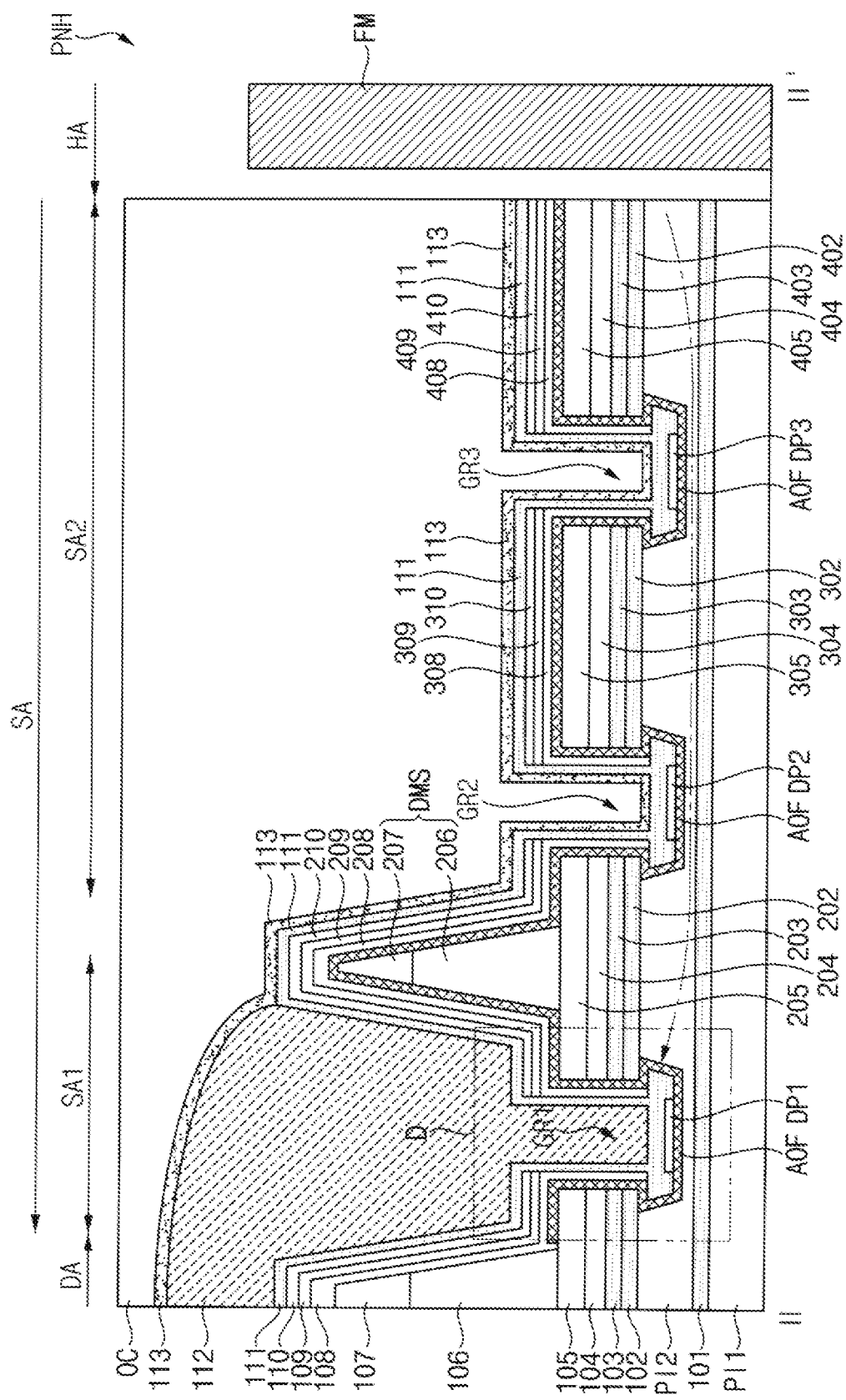
FIG. 14 is a cross-sectional view taken along line II-II' of FIG. 13.
Figure 15:
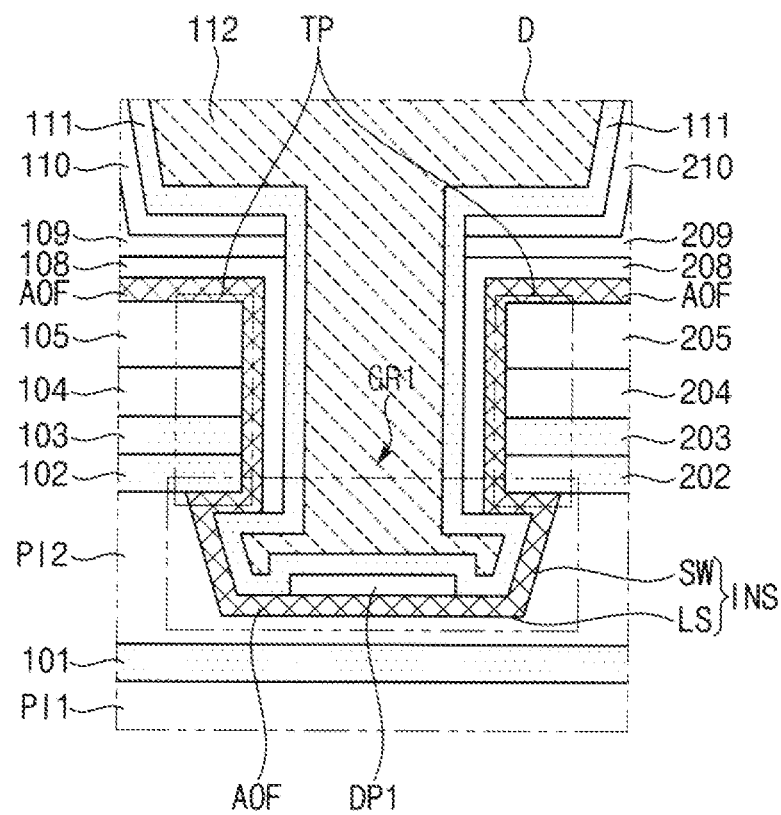
FIG. 15 is an enlarged cross-sectional view of area D of FIG. 14.

FIG. 13 is an enlarged view illustrating a display device according to another embodiment. FIG. 14 is a cross-sectional view taken along line II-II' of FIG. 13. FIG. 15 is an enlarged cross-sectional view of area D of FIG. 14. For example, FIG. 13 may be an enlarged view illustrating another example of an area A of FIG. 1.

FIGS. 13 and 14, a display device 12 according to another embodiment of the present disclosure may have the display area DA, the peripheral area SA, and the hole area HA. The display device 12 may include the functional module FM overlapping the hole area HA and the dam structure DMS overlapping the peripheral area SA.

The grooves may be formed in the peripheral area SA of the display device 12. In one or more embodiments, a first groove GR1 may be formed in the first peripheral area SA1, and second to n-th grooves (where n is an integer greater than or equal to 2) GR2, . . . , and GRn may be formed in the second peripheral area SA2. Each of the first to n-th grooves GR1, GR2, . . . , and GRn may have a shape surrounding the hole area HA on a plane.

However, the display device 12 may be substantially the same as the display device 11 except for an internal structure of each of the first to n-th grooves GR1, GR2, . . . , and GRn. In more detail, the display device 12 may be substantially the same as the display device 11 except for the oxidation resistant film AOF.

In one or more embodiments, the oxidation resistant film AOF may overlap the peripheral area SA. For example, the oxidation resistant film AOF may not overlap the display area DA. In addition, the oxidation resistant film AOF may be entirely on inner walls INS of each of the grooves, and may be between the upper organic layer PI2 and the first inorganic layer 111. The oxidation resistant film AOF will be described in more detail below.

Referring to FIGS. 14 and 15, the upper organic layer PI2 may include the first groove GR1 between the display area DA and the dam structure DMS. The oxidation resistant film AOF, the first dummy pattern DP1, the first inorganic layer 111, and the encapsulation organic layer 112 may be inside the first groove GR1.

In one or more embodiments, the first groove GR1 may have an undercut shape in a cross-sectional view. For example, an area of a top surface of the first groove GR1 may be larger than an area of a bottom surface of the first groove GR1. In addition, the first upper barrier layer 102, the first buffer layer 103, the first gate insulating layer 104, and the first interlayer insulating layer 105 may partially overlap the top surface, and the second upper barrier layer 202, the second buffer layer 203, the second gate insulating layer 204, and the second interlayer insulating layer 205 may partially overlap the top surface. Accordingly, the first upper barrier layer 102, the first buffer layer 103, the first gate insulating layer 104, the first interlayer insulating layer 105, the first upper barrier layer 202, the second buffer layer 203, the second gate insulating layer 204, and the second interlayer insulating layer 205 which are partially overlapping the top surface may be defined as a tip TP.

In one or more embodiments, the oxidation resistant film AOF may be entirely on the inner wall INS of the first groove GR1. For example, the inner wall INS may include a bottom surface LS of the first groove GR1 and a side wall SW of the first groove GR1. For example, the oxidation resistant film AOF may be located along the shape of the first groove GR1.

In one or more embodiments, the oxidation resistant film AOF may include inorganic materials such as silicon oxide ("SiOx"), silicon nitride ("SiNx"), and/or silicon oxynitride ("SiON"). In another embodiment, the oxidation resistant film AOF may include at least one selected from a metal and a metal oxide. For example, the oxidation resistant film AOF may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

In one or more embodiments, the first dummy pattern DP1 may be on the oxidation resistant film AOF overlapping the bottom surface LS. For example, the first dummy pattern DP1 may include the same material as the first organic emission layer 108. For example, the first and second organic emission layers 108 and 208 may be disconnected by (e.g., separated by) the tip TP. As the first and second organic emission layers 108 and 208 are disconnected from each other, a piece of the organic emission layer formed in the first groove GR1 may be defined as the first dummy pattern DP1. As the first dummy pattern DP1 is disconnected from (e.g., separated from) the first and second organic emission layers 108 and 208 and is on the oxidation resistant film AOF, the first dummy pattern DP1 may delay or reduce the penetration of moisture and/or oxygen.

In one or more embodiments, the first inorganic layer 111 may be on the oxidation resistant film AOF in the inside the first groove GR1. For example, the oxidation resistant film AOF may be between the upper organic layer PI2 and the first inorganic layer 111. The encapsulation organic layer 112 may fill the inside of the first groove GR1.

The display device 12 may include the oxidation resistant film AOF surrounding the inner wall INS of the first groove GR1. The oxidation resistant film AOF may be between the upper organic layer PI2 and the first inorganic layer 111. Accordingly, the oxidation resistant film AOF may protect the first inorganic layer 111 from moisture and/or oxygen penetrating through the upper organic layer PI2 adjacent to the hole area HA. Because the oxidation resistant film AOF may delay or reduce oxidation of the first inorganic layer 111, reliability of the display device 12 may be improved.

FIGS. 16 to 20 are cross-sectional views illustrating a method of manufacturing the display device of FIG. 13 according to an embodiment.

Referring to FIGS. 16 to 20, the oxidation resistant film AOF may be formed using a separate mask.

Figure 16:
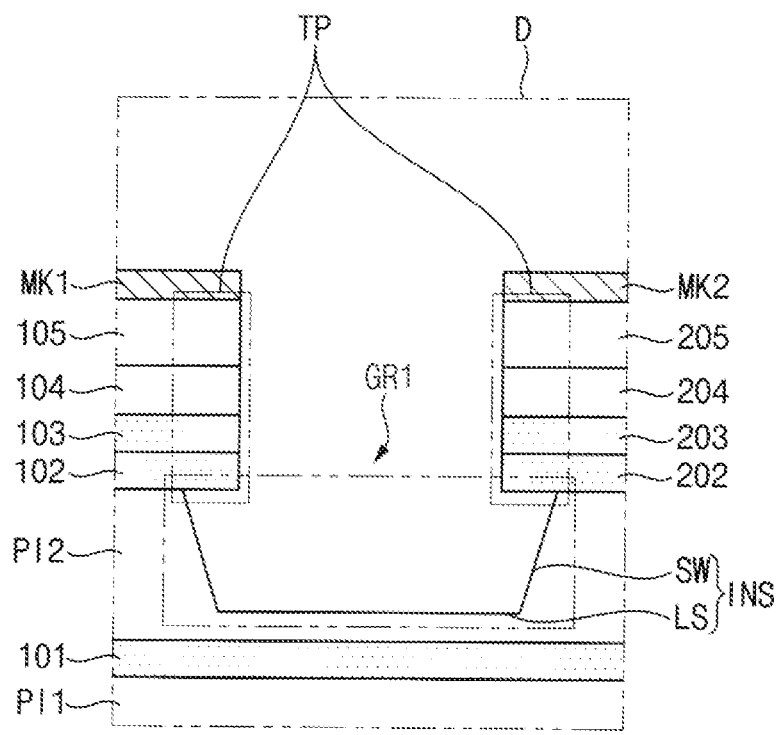
FIGS. 16 to 20 are cross-sectional views illustrating a method of manufacturing the display device of FIG. 13 according to an embodiment.

In more detail, as shown in FIG. 16, the first mask pattern MK1 may be on the first interlayer insulating layer 105, and the second mask pattern MK2 may be on the second interlayer insulating layer 205. Thereafter, a portion of the upper organic layer PI2 may be removed through a first etching process. Accordingly, the first groove GR1 having an undercut shape may be formed.

Figure 17:
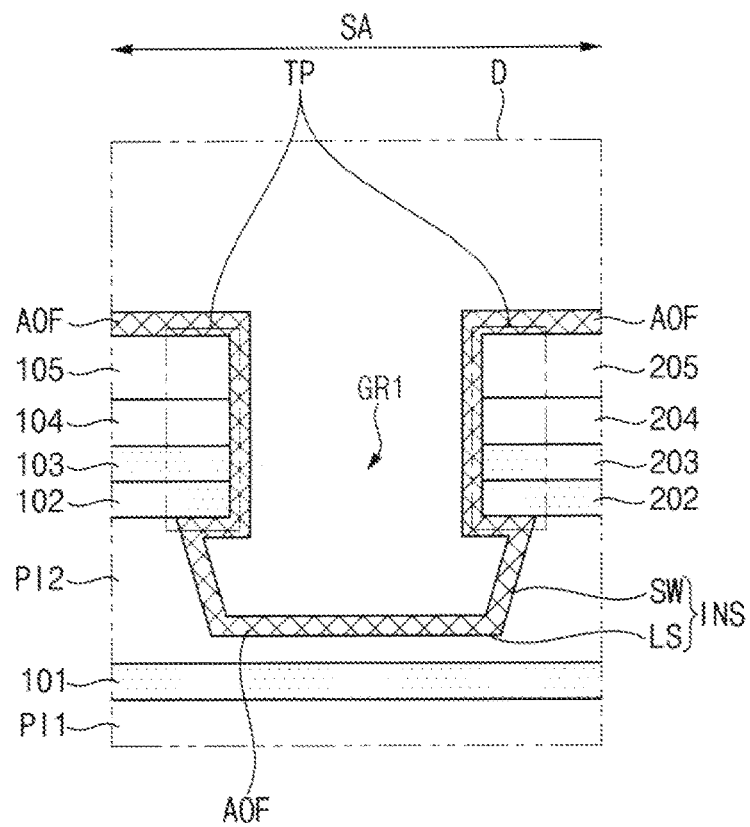

As shown in FIG. 17, the first and second mask patterns MK1 and MK2 may be removed, and the oxidation resistant film AOF may be formed. For example, the oxidation resistant film AOF may be formed using a chemical vapor deposition ("CVD") process. In one or more embodiments, the oxidation resistant film AOF may be formed only in the peripheral area SA using the mask. For example, the mask may be an open mask including a shielding portion overlapping the display area DA and an opening portion overlapping the peripheral area SA. Accordingly, the oxidation resistant film AOF may not be formed in the display area DA, and may be formed only in the peripheral area SA.

Figure 18:
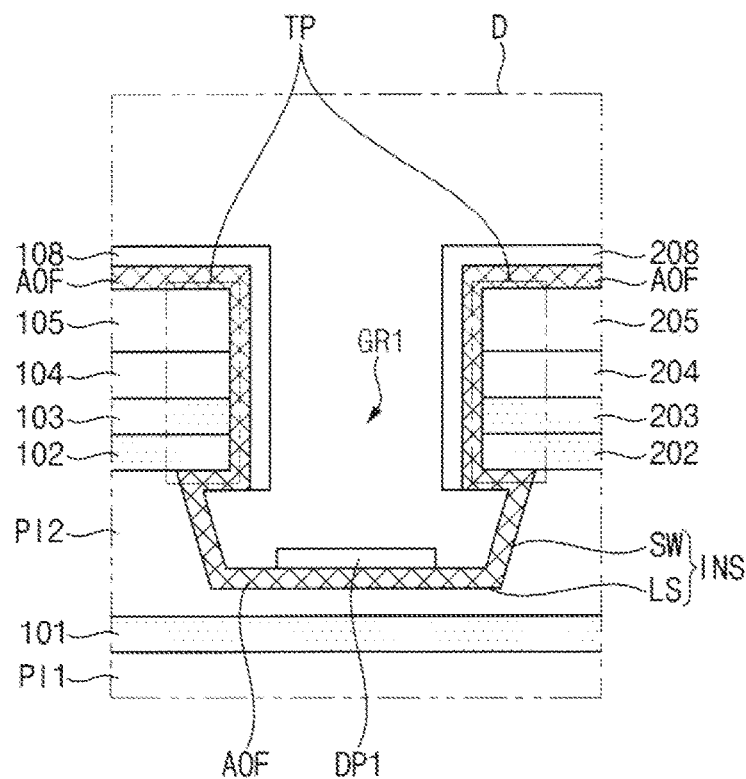

Referring to FIG. 18, the first organic emission layer 108, the first dummy pattern DP1, and the second organic emission layer 208 may be formed. In one or more embodiments, the first organic emission layer 108, the first dummy pattern DP1, and the second organic emission layer 208 may be formed together. Accordingly, the first dummy pattern DP1 may include the same material as the first and second organic emission layers 108 and 208.

In addition, the first organic emission layer 108, the first dummy pattern DP1, and the second organic emission layer 208 may be disconnected by (e.g., separated by) the tip TP. For example, by anisotropic deposition in a vacuum deposition process, the first organic emission layer 108, the first dummy pattern DP1, and the second organic emission layer 208 may not be formed under the tip TP. Accordingly, the first dummy pattern DP1 may be formed on the oxidation resistant film AOF. For example, the oxidation resistant film AOF may be between the upper organic layer PI2 and the first dummy pattern DP1.

Figure 19:
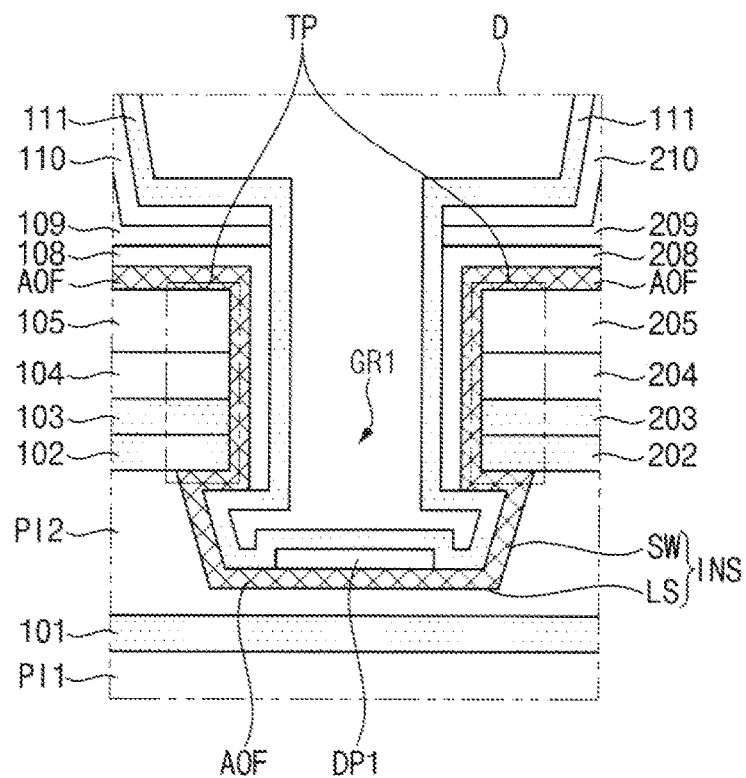

Referring to FIG. 19, the first capping layer 109 and the second capping layer 209 may be formed, and the first protective layer 110 and the second protective layer 210 may be formed. In addition, the first inorganic layer 111 may be formed. In one or more embodiments, the first inorganic layer 111 may be formed using a chemical vapor deposition ("CVD") process. Accordingly, the first inorganic layer 111 may be formed along profiles of the first protective layer 110, the oxidation resistant film AOF, the first dummy pattern DP1, and the second protective layer 210.

Figure 20:
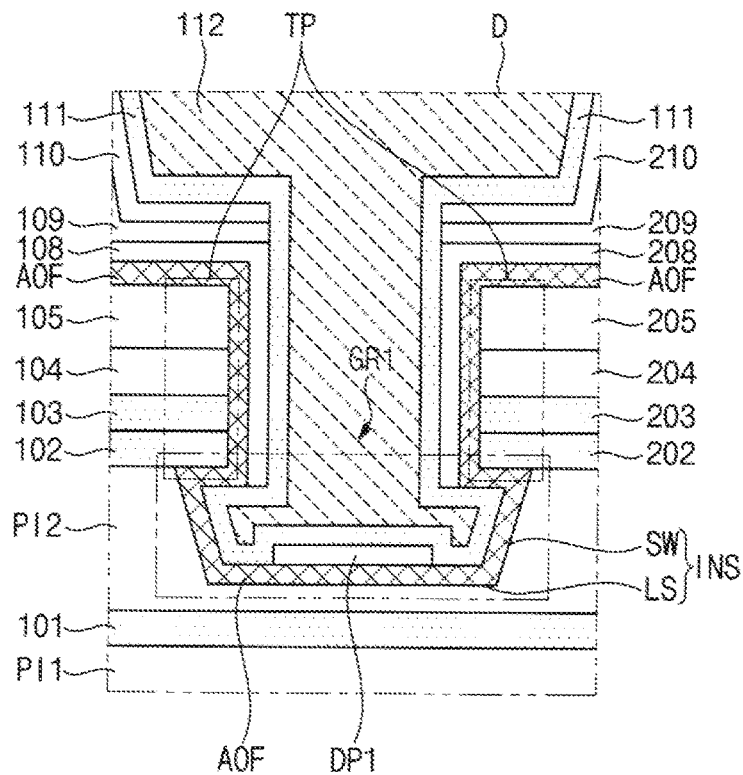

As shown in FIG. 20, the encapsulation organic layer 112 may be formed. In one or more embodiments, the encapsulation organic layer 112 may fill the inside of the first groove GR1.

FIGS. 21 to 28 are cross-sectional views illustrating a method of manufacturing the display device of FIG. 13 according to another embodiment.

Referring to FIGS. 21 to 28, the oxidation resistant film AOF may be formed using a photoresist pattern PR.

Figure 21:
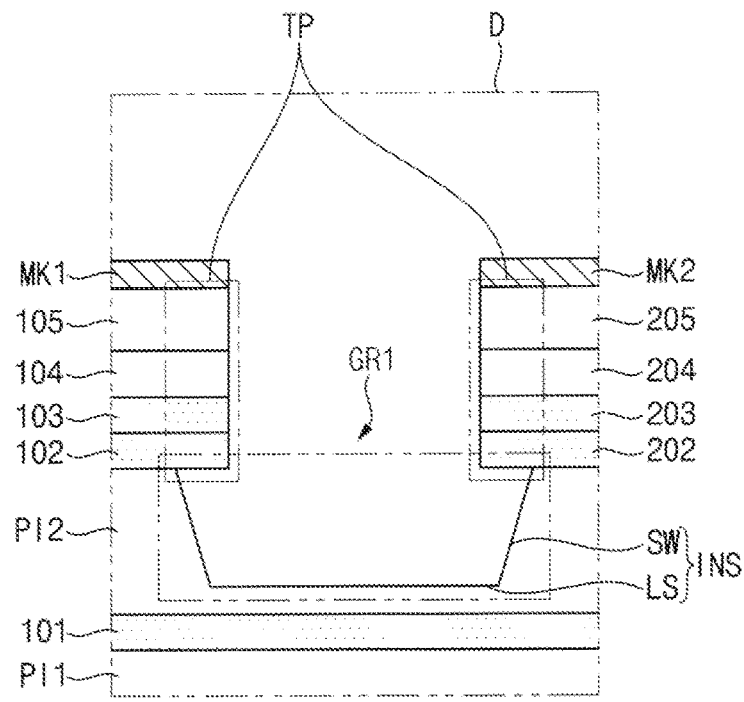
FIGS. 21 to 28 are cross-sectional views illustrating a method of manufacturing the display device of FIG. 13 according to another embodiment.

In more detail, as shown in FIG. 21, the first mask pattern MK1 may be on the first interlayer insulating layer 105, and the second mask pattern MK2 may be on the second interlayer insulating layer 205. Thereafter, a portion of the upper organic layer PI2 may be removed through a first etching process. Accordingly, the first groove GR1 having an undercut shape may be formed.

Figure 22:
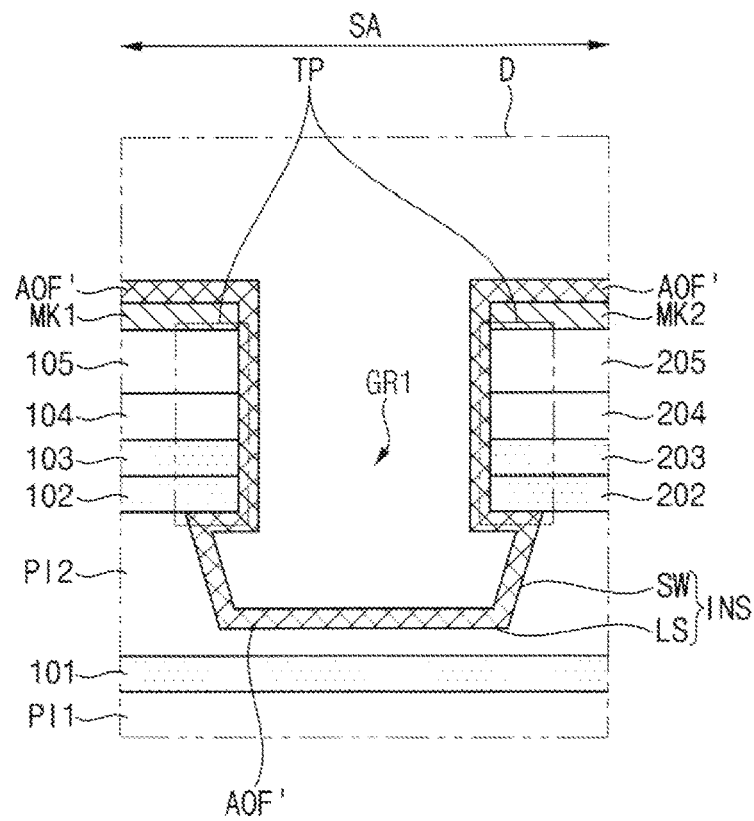

As shown in FIG. 22, a preliminary oxidation resistant film AOF' may be formed. For example, the preliminary oxidation resistant film AOF' may be formed using a chemical vapor deposition ("CVD") process. In one or more embodiments, the preliminary oxidation resistant film AOF' may be formed without using the mask. Accordingly, the preliminary oxidation resistant film AOF' may be formed in the display area DA and the peripheral area SA.

Figure 23:
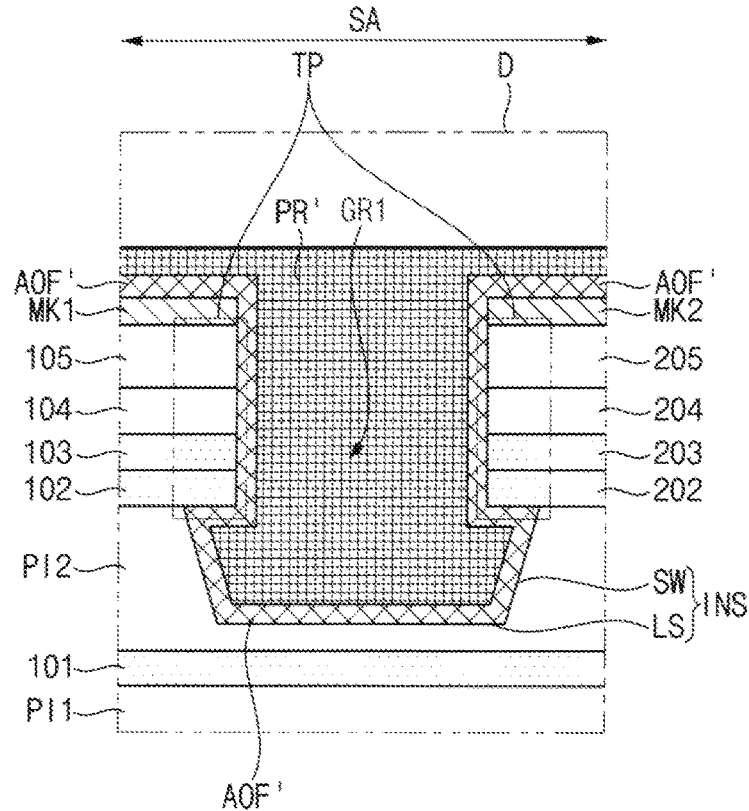

As shown in FIG. 23, a preliminary photoresist pattern PR' may be formed. The preliminary photoresist pattern PR' may be coated on the entire surface of the display device 12. For example, the preliminary photoresist pattern PR' may overlap the display area DA and the peripheral area SA.

Figure 24:
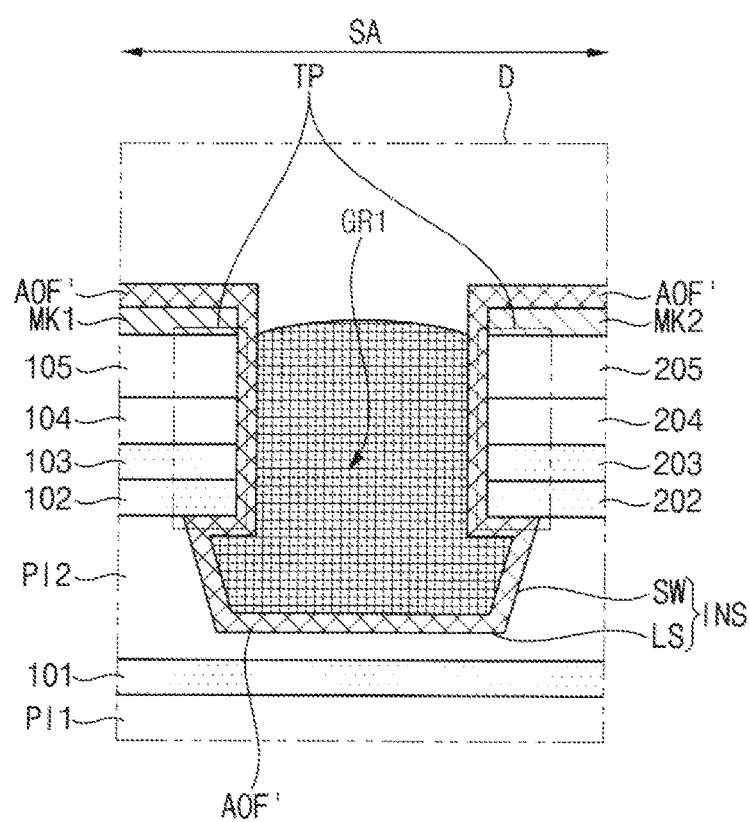

As shown in FIG. 24, the photoresist pattern PR may be formed. In one or more embodiments, the photoresist pattern PR may be patterned to remain only inside the first groove GR1. For example, the preliminary photoresist pattern PR' may be entirely exposed. Because a thickness of the preliminary photoresist pattern PR' formed in the inside of the first groove GR1 is larger than a thickness of the preliminary photoresist pattern PR' formed on the preliminary oxidation resistant film AOF', the preliminary photoresist pattern PR' having a relatively small thickness may be partially removed. Accordingly, the preliminary oxidation resistant film AOF' which does not overlap the photoresist pattern PR may be exposed. However, a shape of the patterned photoresist pattern PR is not limited to the shape shown in FIG. 24. For example, the shape of the patterned photoresist pattern PR may be variously set as necessary or desired.

Figure 25:
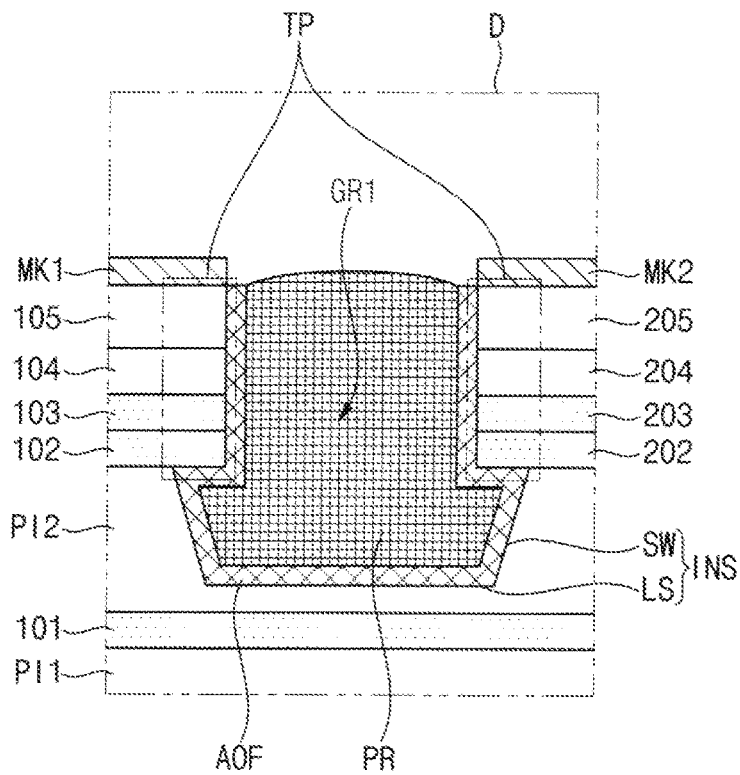

As shown in FIG. 25, the oxidation resistant film AOF may be formed. In one or more embodiments, the preliminary oxidation resistant film AOF' exposed through the second etching process may be removed. Accordingly, the oxidation resistant film AOF may be entirely formed on the inner wall INS of the first groove GR1. In addition, the oxidation resistant film AOF may be formed so as not to overlap the display area DA.

Figure 26:
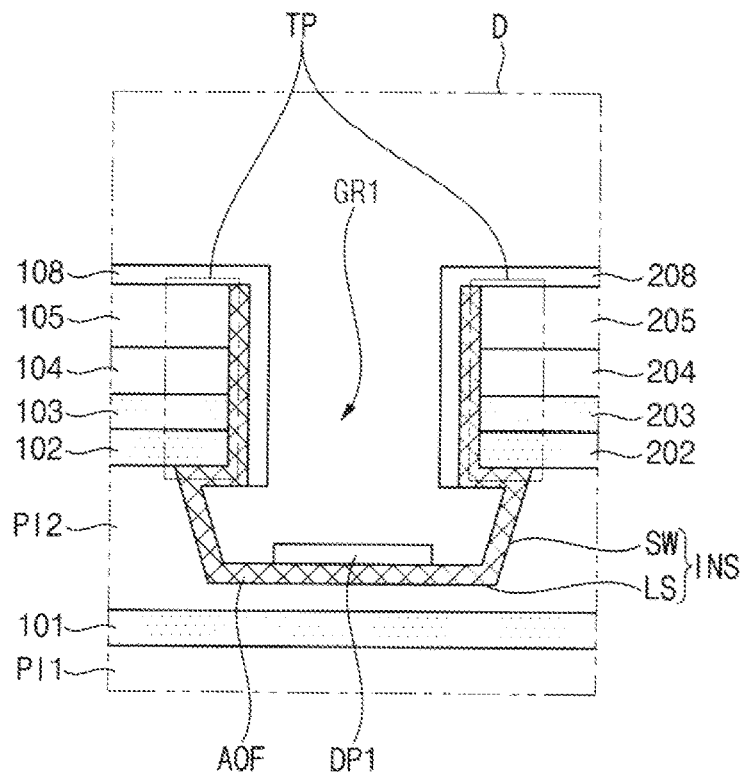

As shown in FIG. 26, the first and second mask patterns MK1 and MK2 may be removed. Thereafter, the first organic emission layer 108, the first dummy pattern DP1, and the second organic emission layer 208 may be formed. In one or more embodiments, the first organic emission layer 108, the first dummy pattern DP1, and the second organic emission layer 208 may be formed together. Accordingly, the first dummy pattern DP1 may include the same material as the first and second organic emission layers 108 and 208.

Figure 27:
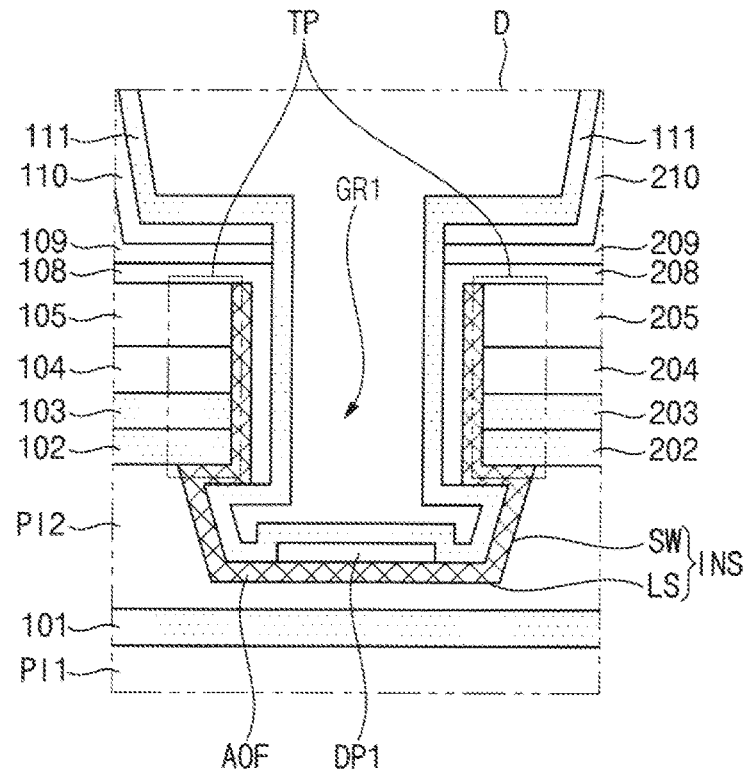

As shown in FIG. 27, the first capping layer 109 and the second capping layer 209 may be formed, and the first protective layer 110 and the second protective layer 210 may be formed. In addition, the first inorganic layer 111 may be formed. In one or more embodiments, the first inorganic layer 111 may be formed using a chemical vapor deposition ("CVD") process. Accordingly, the first inorganic layer 111 may be formed along profiles of the first protective layer 110, the oxidation resistant film AOF, the first dummy pattern DP1, and the second protective layer 210.

Figure 28:
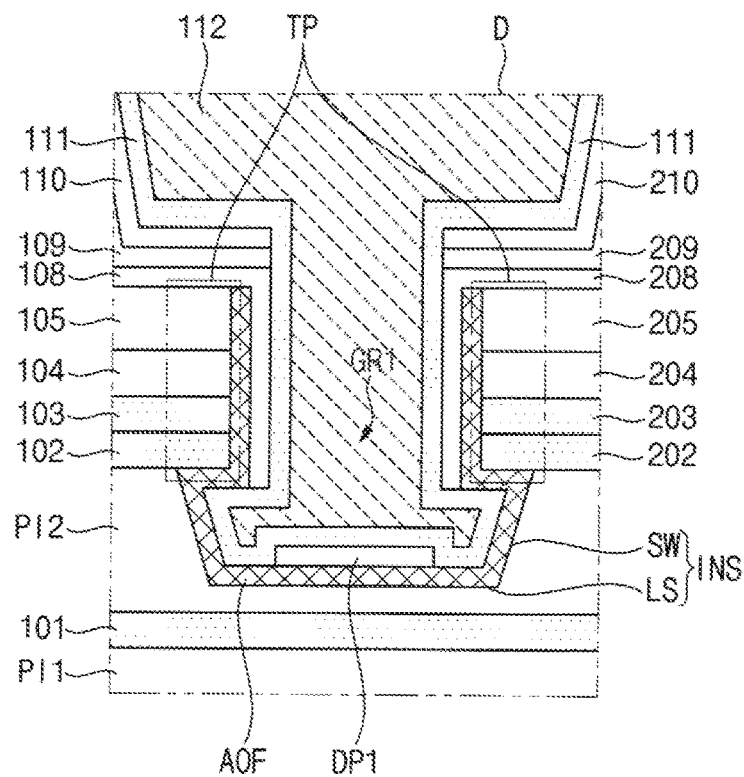

As shown in FIG. 28, the encapsulation organic layer 112 may be formed. In one or more embodiments, the encapsulation organic layer 112 may fill the inside of the first groove GR1.

FIGS. 29 to 33 are cross-sectional views illustrating a method of manufacturing the display device of FIG. 13 according to still another embodiment.

Referring to FIGS. 29 to 33, the oxidation resistant film AOF may be formed using a photoresist pattern PR.

Figure 29:
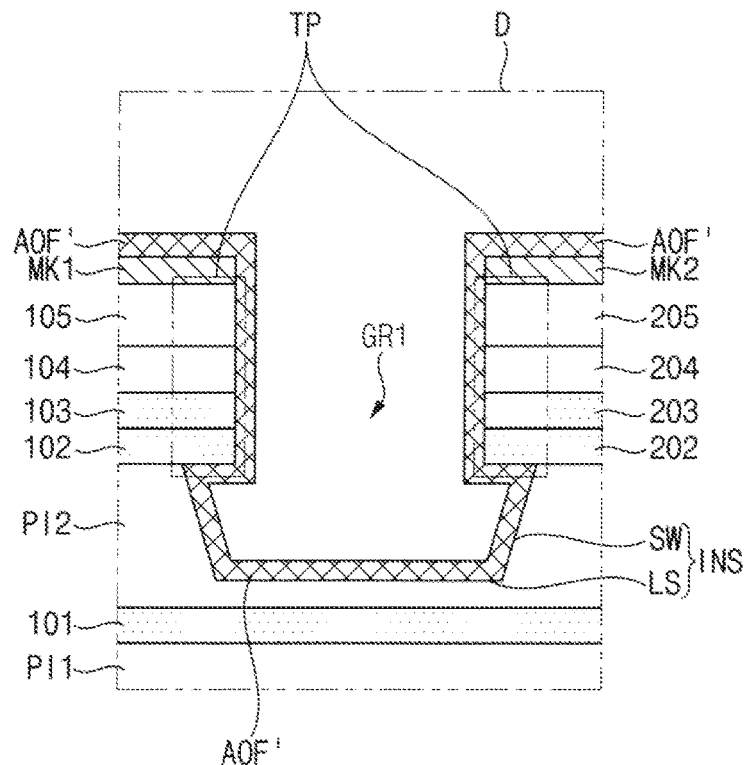
FIGS. 29 to 33 are cross-sectional views illustrating a method of manufacturing the display device of FIG. 13 according to still another embodiment.

In more detail, as shown in FIG. 29, the first mask pattern MK1, the second mask pattern MK2, the first groove GR1, and the preliminary oxidation resistant film AOF' may be formed. However, the first mask pattern MK1, the second mask pattern MK2, the first groove GR1, and the preliminary oxidation resistant film AOF' may be substantially the same as the first mask pattern MK1, the second mask pattern MK2, the first groove GR1, and the preliminary oxidation resistant film AOF'.

Figure 30:
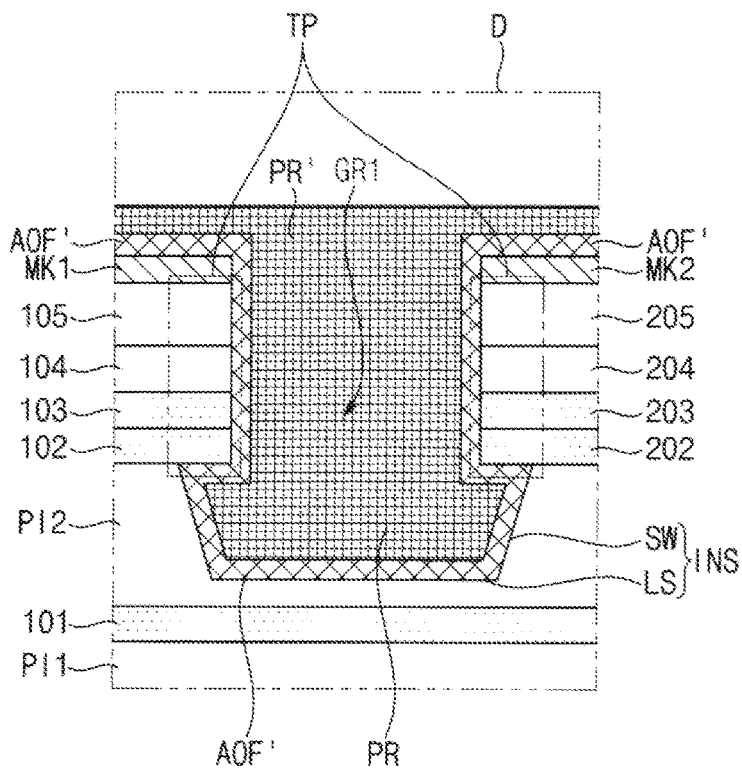

As shown in FIG. 30, the preliminary photoresist pattern PR' may be formed. The preliminary photoresist pattern PR' may be coated on the entire surface of the display device 12. For example, the preliminary photoresist pattern PR' may overlap the display area DA and the peripheral area SA.

Figure 31:
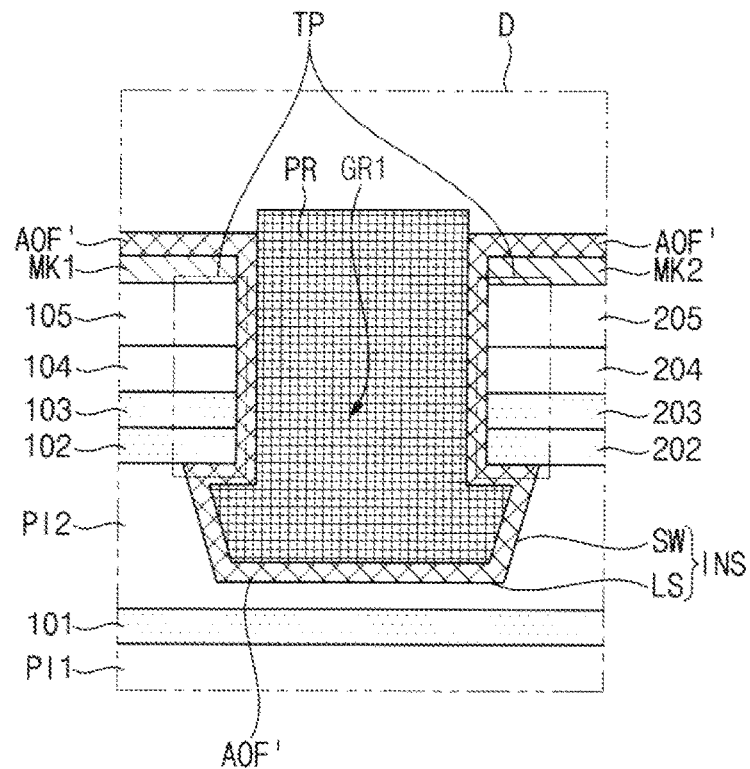

As shown in FIG. 31, the photoresist pattern PR may be formed. In one or more embodiments, the photoresist pattern PR may be patterned to remain only inside the first groove GR1. For example, the preliminary photoresist pattern PR' may be partially exposed. Accordingly, the preliminary photoresist pattern PR' may be partially removed. For example, the preliminary photoresist pattern PR' which does not overlap the first groove GR1 may be removed. Accordingly, the preliminary oxidation resistant film AOF' which does not overlap the photoresist pattern PR may be exposed. However, a shape of the patterned photoresist pattern PR is not limited to the shape shown in FIG. 24. For example, the shape of the patterned photoresist pattern PR may be variously set as necessary or desired.

Figure 32:
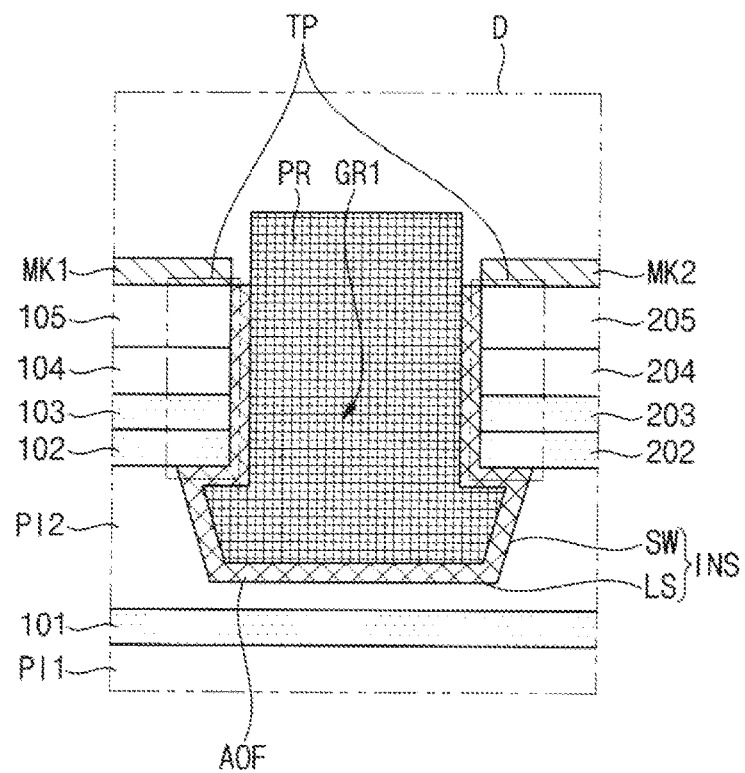

As shown in FIG. 32, the oxidation resistant film AOF may be formed. In one or more embodiments, the exposed preliminary oxidation resistant film AOF' may be removed. Accordingly, the oxidation resistant film AOF may be entirely formed on the inner wall INS of the first groove GR1. In addition, the oxidation resistant film AOF may be formed so as not to overlap the display area DA.

Figure 33:
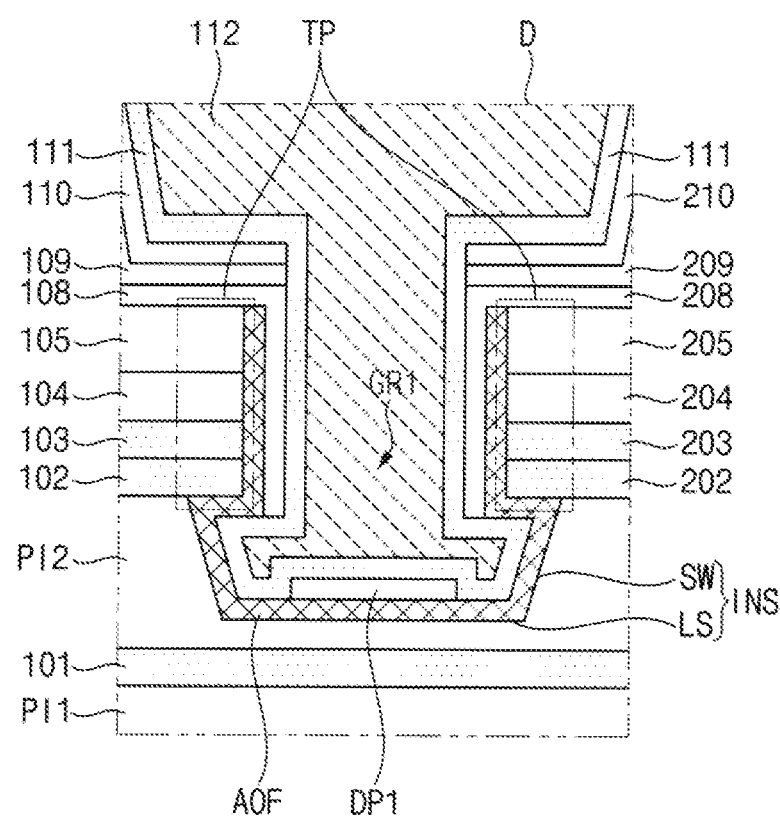

As shown in FIG. 33, the first and second mask patterns MK1 and MK2 may be removed. In addition, the first organic emission layer 108, the first dummy pattern DP1, the second organic emission layer 208, the first capping layer 109, the second capping layer 209, the first protective layer 110, the second protective layer 210, the first inorganic layer 111, and the encapsulation organic layer 112 may be formed. However, the first organic emission layer 108, the first dummy pattern DP1, the second organic emission layer 208, the first capping layer 109, the second capping layer 209, the first protective layer 110, the second protective layer 210, the first inorganic layer 111, and the encapsulation organic layer 112 may be substantially the same as the first organic emission layer 108, the first dummy pattern DP1, the second organic emission layer 208, the first capping layer 109, the second capping layer 209, the first protective layer 110, the second protection layer 210, the first inorganic layer 111, and the encapsulation organic layer 112 described with reference to FIGS. 26 to 28.

The display devices 11 and 12 according to embodiments may include the oxidation resistant film AOF surrounding the side wall SW and/or the inner wall INS of the first groove GR1. The oxidation resistant film AOF may be between the upper organic layer PI2 and the first inorganic layer 111. Accordingly, the oxidation resistant film AOF may protect the first inorganic layer 111 from moisture and/or oxygen penetrating through the upper organic layer PI2 adjacent to the hole area HA. Because the oxidation resistant film AOF may delay or reduce oxidation of the first inorganic layer 111, reliability of the display devices 11 and 12 may be improved.

Although aspects of certain example embodiments and implementations have been described herein, other embodiments and modifications will be apparent from this description. Accordingly, embodiments according to the present disclosure are not limited to the disclosed embodiments, but rather are entitled to the broader scope of the appended claims and their equivalents, and various modifications and equivalent arrangements as would be apparent to a person of ordinary skill in the art.

What is claimed is:

1. A method of manufacturing a display device, the method comprising:
    preparing a substrate having a hole area, a peripheral area surrounding the hole area, and a display area surrounding the peripheral area;
    forming at least one groove overlapping the peripheral area;
    forming an oxidation resistant film on an inner wall of the groove; and
    forming a first inorganic layer overlapping the display area on the substrate,
    wherein the first inorganic layer overlaps the display area and the peripheral area, and
    wherein the oxidation resistant film is formed between the substrate and the first inorganic layer.

2. The method of claim 1, wherein the inner wall of the groove comprises a bottom surface of the groove and a side wall of the groove, and
    wherein the oxidation resistant film contacts the bottom surface and the side wall.

3. The method of claim 1, wherein the oxidation resistant film is formed using an open mask comprising a shielding portion overlapping the display area and an opening portion overlapping the peripheral area.

4. The method of claim 1, wherein the forming the oxidation resistant film comprises:
    forming a preliminary oxidation resistant film overlapping the peripheral area and the display area;
    forming a photoresist pattern on an inside of the groove; and
    removing a portion of the preliminary oxidation resistant film that does not overlap with the photoresist pattern.

5. The method of claim 4, wherein the forming the photoresist pattern in the inside of the groove comprises:
    forming a preliminary photoresist pattern overlapping the peripheral area and the display area; and
    entirely exposing the preliminary photoresist pattern.

6. The method of claim 4, wherein the forming the photoresist pattern in the inside of the groove comprises:
    forming a preliminary photoresist pattern overlapping the peripheral area and the display area; and
    partially exposing the preliminary photoresist pattern.

7. The method of claim 1, further comprising:
    forming a first electrode overlapping the display area;
    forming an organic emission layer overlapping the display rea and the peripheral area on the first electrode;
    forming a dummy pattern between the oxidation resistant film and the first inorganic layer; and
    forming a second electrode between the organic emission layer and the first inorganic layer,
    wherein the dummy pattern is formed together with the organic emission layer.

8. The method of claim 7, wherein the dummy pattern contacts the oxidation resistant film.

9. The method of claim 1, wherein the oxidation resistant film comprises at least one selected from the group consisting of silicon oxide, silicon nitride, and silicon oxynitride.

10. The method of claim 1, wherein the oxidation resistant film comprises at least one selected from the group consisting of metal and metal oxide.

11. A display device comprising:
    a substrate having a hole area, a peripheral area surrounding the hole area, and a display area surrounding the peripheral area and having a penetration hole overlapping the hole area and at least one groove overlapping the peripheral area;

an emission structure on the substrate, overlapping the display area, and comprising a first inorganic layer; and an oxidation resistant film entirely on an inner wall of the groove, wherein the first inorganic layer overlaps the display area and the peripheral area, and wherein the oxidation resistant film is between the substrate and the first inorganic layer.

12. The display device of claim 11, wherein the inner wall of the groove comprises a bottom surface of the groove and a side wall of the groove, and wherein the oxidation resistant film contacts the bottom surface and the side wall.

13. The display device of claim 11, wherein the emission structure further comprises:

a first electrode;

an organic emission layer on the first electrode; and a second electrode between the organic emission layer and the first inorganic layer, and wherein a dummy pattern comprising a same material as the organic emission layer is between the oxidation resistant film and the first inorganic layer.

14. The display device of claim 13, wherein the dummy pattern contacts the oxidation resistant film.

15. The display device of claim 11, wherein the oxidation resistant film comprises at least one selected from the group consisting of silicon oxide, silicon nitride, and silicon oxynitride.

16. The display device of claim 11, wherein the oxidation resistant film comprises at least one selected from the group consisting of metal and metal oxide.

17. The display device of claim 11, further comprising:

a functional module at least partially inside the penetration hole.

18. A display device comprising:

a substrate having a hole area, a peripheral area surrounding the hole area, and a display area surrounding the peripheral area and having a penetration hole overlapping the hole area and at least one groove overlapping the peripheral area;

an emission structure on the substrate, overlapping the display area, and comprising a first inorganic layer; and an oxidation resistant film on an inside of the groove and having an opening exposing the substrate, wherein the first inorganic layer overlaps the display area and the peripheral area, and wherein the oxidation resistant film is between the substrate and the first inorganic layer.

19. The display device of claim 18, wherein the oxidation resistant film surrounds a side wall of the inside of the groove.

20. The display device of claim 18, wherein the groove comprises a first area overlapping the opening and second area surrounding the first area, and wherein the oxidation resistant film overlaps the second area, and does not overlap the display area and the first area.

* * * * *